US012454036B2

(12) United States Patent
Oh et al.

(10) Patent No.: US 12,454,036 B2
(45) Date of Patent: Oct. 28, 2025

(54) SUBSTRATE HANDLING SYSTEMS AND METHODS FOR CMP PROCESSING

(71) Applicant: Applied Materials, Inc., Santa Clara, CA (US)

(72) Inventors: Jeonghoon Oh, Saratoga, CA (US); Manoj A. Gajendra, Bangalore (IN); John Anthony Garcia, San Jose, CA (US); Chetan Kumar Mylappanahalli Narasingaiah, Bangalore (IN); Sanjay Bhanurao Chavan, Bangalore (IN); Gagan Dobhal, Bangalore (IN); Manoj Balakumar, Bangalore (IN); Jamie Stuart Leighton, Palo Alto, CA (US); Van H. Nguyen, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 566 days.

(21) Appl. No.: 17/407,062

(22) Filed: Aug. 19, 2021

(65) Prior Publication Data

US 2022/0072682 A1 Mar. 10, 2022

Related U.S. Application Data

(60) Provisional application No. 63/075,607, filed on Sep. 8, 2020.

(51) Int. Cl.
*B24B 57/02* (2006.01)
*B24B 37/04* (2012.01)
(Continued)

(52) U.S. Cl.
CPC ............ *B24B 57/02* (2013.01); *B24B 37/042* (2013.01); *B24B 37/105* (2013.01); *B24B 37/30* (2013.01);
(Continued)

(58) Field of Classification Search
CPC . B24B 27/0069; B24B 37/345; B24B 41/005; B24B 27/0023; B24B 7/228;
(Continued)

(56) References Cited

U.S. PATENT DOCUMENTS

| 5,738,574 A | 4/1998 | Tolles et al. |
| 6,080,046 A | 6/2000 | Shendon et al. |

(Continued)

FOREIGN PATENT DOCUMENTS

| CN | 1531747 A | 9/2004 |
| CN | 105051882 A | 11/2015 |

(Continued)

OTHER PUBLICATIONS

Perfluoroalkoxy alkane, Wikipedia, dated ,Jun. 22, 2019 (Year: 2019).*

(Continued)

*Primary Examiner* — David S Posigian
*Assistant Examiner* — Steven Huang

(57) ABSTRACT

A system and method for sequential single-sided CMP processing of opposite facing surfaces of a silicon carbide (SiC) substrate are disclosed. A method includes urging a first surface of a substrate against one of plurality of polishing pads, wherein the plurality of polishing pads are disposed on corresponding ones of a plurality of rotatable polishing platens. The method includes transferring, using the first side of the end effector, the substrate from the substrate carrier loading station to a substrate alignment station. The method includes transferring, using the first side of the end effector, the substrate from the substrate alignment station to a substrate carrier loading station. The method includes urging a second surface of the substrate against one of the plurality of polishing platens.

20 Claims, 13 Drawing Sheets

(51) Int. Cl.
   *B24B 37/10* (2012.01)
   *B24B 37/30* (2012.01)
   *B24B 37/34* (2012.01)
   *H01L 21/02* (2006.01)

(52) U.S. Cl.
   CPC ........ *B24B 37/34* (2013.01); *H01L 21/02013* (2013.01); *H01L 21/02016* (2013.01); *H01L 21/02019* (2013.01)

(58) Field of Classification Search
   CPC ..... B24B 37/10; B24B 37/005; B24B 37/042; H01L 21/67745; H01L 21/68707; B65G 47/244; B65G 47/1478; B65B 35/58; B65B 35/18; B65H 9/12; B25J 11/0095; G05B 2219/39508
   USPC .......... 451/339, 41; 414/941, 267, 738, 737, 414/816, 758, 783, 763, 416.08, 416.01, 414/936, 937; 901/31; 294/213
   See application file for complete search history.

(56) References Cited

U.S. PATENT DOCUMENTS

| | | | |
|---|---|---|---|
| 6,086,457 | A | 7/2000 | Perlov et al. |
| 6,126,517 | A | 10/2000 | Tolles et al. |
| 6,361,422 | B1 | 3/2002 | Ettinger et al. |
| 6,406,359 | B1 | 6/2002 | Birang et al. |
| 6,435,941 | B1 | 8/2002 | White |
| 6,572,730 | B1 | 6/2003 | Shah |
| 6,613,200 | B2 | 9/2003 | Li et al. |
| 6,656,028 | B2 | 12/2003 | Chokshi et al. |
| 6,677,239 | B2 | 1/2004 | Hsu et al. |
| 6,679,755 | B1 | 1/2004 | Sommer et al. |
| 6,817,923 | B2 | 11/2004 | Smith |
| 6,818,066 | B2 | 11/2004 | Cheung |
| 6,887,124 | B2 | 5/2005 | Pinson, II et al. |
| 7,008,303 | B2 | 3/2006 | White et al. |
| 7,048,607 | B1 | 5/2006 | Wu et al. |
| 7,097,534 | B1 | 8/2006 | Yampolskiy et al. |
| 7,265,382 | B2 | 9/2007 | Lymberopoulos et al. |
| 7,390,744 | B2 | 6/2008 | Jia et al. |
| 7,433,759 | B2 | 10/2008 | Nangoy |
| 7,952,708 | B2 | 5/2011 | Ravid et al. |
| 8,308,529 | B2 | 11/2012 | D'Ambra et al. |
| 8,322,963 | B2 | 12/2012 | Hudgens et al. |
| 8,460,057 | B2 | 6/2013 | Swedek et al. |
| 9,138,860 | B2 | 9/2015 | Dhandapani et al. |
| 9,218,996 | B2 | 12/2015 | Gajendra |
| 9,711,381 | B2 | 7/2017 | Ko et al. |
| 2001/0008801 | A1 | 7/2001 | Toyama |
| 2003/0209320 | A1 | 11/2003 | Sommer |
| 2005/0048880 | A1 | 3/2005 | Tolles et al. |
| 2005/0092620 | A1 | 5/2005 | Mavliev et al. |
| 2006/0246822 | A1 | 11/2006 | Swedek et al. |
| 2007/0151866 | A1 | 7/2007 | Wang et al. |
| 2007/0238399 | A1 | 10/2007 | Tolles et al. |
| 2008/0093022 | A1 | 4/2008 | Yilmaz et al. |
| 2008/0157455 | A1* | 7/2008 | Lester ............... H01L 21/67326 269/287 |
| 2009/0061739 | A1* | 3/2009 | Jeong .................... B24B 37/345 451/103 |
| 2012/0255795 | A1 | 10/2012 | Fenske et al. |
| 2012/0322345 | A1 | 12/2012 | Rangarajan et al. |
| 2013/0115862 | A1 | 5/2013 | Rangarajan et al. |
| 2014/0154036 | A1* | 6/2014 | Mattern ............. B65G 47/1478 414/816 |
| 2014/0271085 | A1 | 9/2014 | Gajendra |
| 2016/0218030 | A1 | 7/2016 | Embertson et al. |
| 2017/0287759 | A1* | 10/2017 | Kanazawa ........ H01L 21/67712 |
| 2018/0056479 | A1 | 3/2018 | Hu et al. |

FOREIGN PATENT DOCUMENTS

| | | |
|---|---|---|
| CN | 211332378 U | 8/2020 |
| EP | 0402520 A2 | 12/1990 |
| EP | 0774323 A2 | 5/1997 |
| JP | H10284448 A | 10/1998 |
| JP | 2008078673 A | 4/2008 |
| TW | 200922746 A | 6/2009 |
| WO | 2003101669 A1 | 12/2003 |
| WO | 2006124472 A2 | 11/2006 |
| WO | 2007041020 A1 | 4/2007 |
| WO | 2007114964 A2 | 10/2007 |
| WO | 2010019339 A2 | 2/2010 |
| WO | 2014149340 A1 | 9/2014 |

OTHER PUBLICATIONS

Polytetrafluoroethylene, Wikiepdia, dated May 19, 2019 (Year: 2019).*
International Search Report and Written Opinion for International Application No. PCT/US2021/046605 dated Jun. 10, 2022.
Office Action for Japanese Application No. 2023-512062 dated Jul. 2, 2024.
TW Office action dated Jan. 2, 2024 for Application No. 110131615.
TW Office Action Dtd Aug. 30, 2024 for TW 113124645.
Office Action for Japanese Application No. 2023-512062 dated Jan. 28, 2025.
Office Action for Korean Application No. 10-2023-7011710 dated May 29, 2024.
Extended European Search Report for European Application No. 21876184.9 dated Sep. 18, 2024.
Office Action for Chinese Application No. 202180061781.3 dated Jun. 6, 2025.
Search Report for Chinese Application No. 202180061781.3 dated May 26, 2025.

* cited by examiner

SUBSTRATE HANDLING SYSTEMS AND METHODS FOR CMP PROCESSING

CROSS-REFERENCE TO RELATED APPLICATIONS

This application claims the benefit of U.S. Provisional Patent Application Ser. No. 63/075,607, filed on Sep. 8, 2020, the entirety of which is herein incorporated by reference.

BACKGROUND

Field

Embodiments described herein generally relate to chemical mechanical polishing (CMP) systems and processes used in the manufacturing of electronic devices. In particular, embodiments herein relate to substrate handling schemes for sequential single-sided CMP processing of opposite facing surfaces of a substrate, such as a silicon carbide (SiC) substrate.

Description of the Related Art

Chemical mechanical polishing (CMP) is commonly used in the manufacturing of semiconductor devices to planarize or polish a layer of material deposited on a crystalline silicon (Si) substrate surface. In a typical CMP process, the substrate is retained in a substrate carrier which presses the backside of the substrate towards a rotating polishing pad in the presence of a polishing fluid. Generally, the polishing fluid comprises an aqueous solution of one or more chemical constituents and nanoscale abrasive particles suspended in the aqueous solution. Material is removed across the material layer surface of the substrate in contact with the polishing pad through a combination of chemical and mechanical activity which is provided by the polishing fluid and the relative motion of the substrate and the polishing pad.

CMP may also be used in the preparation of crystalline silicon carbide (SiC) substrates which, due to the unique electrical and thermal properties thereof, provide superior performance to Si substrates in advanced high power and high frequency semiconductor device applications. The SiC substrate is typically sliced from a single crystal ingot to provide circular shaped wafer having a silicon terminated surface (Si surface) and a carbon terminated surface (C surface), that is opposite of the Si surface. Each of the Si surface and the C surface are then typically processed to a desired thickness and surface finish using a combination of grinding, lapping, and CMP processing operations. For example, a CMP process may be used to planarize one or both of the Si surface and C surface, to remove sub-surface damage caused by the previous grinding and/or lapping operations, and/or to prepare the SiC substrate for subsequent epitaxial SiC growth thereon.

The CMP process of the Si and C surfaces may be performed concurrently, e.g., by using a double-sided polishing system, or sequentially, using a single-sided polishing system. Due to their different atomic compositions, and thus different reactivity to the CMP process, different polishing results for the Si and C surfaces, such as material removal rate and finished surface roughness, are achieved for the same polishing parameters. Sequential single-sided polishing of the Si and C surfaces advantageously allows for fine tuning of the respective CMP processes used therewith to provide improved surface finish results when compared with double-sided polishing.

Repurposed single-sided polishing systems previously used for CMP processing in semiconductor device manufacturing provide the fine control desired for SiC substrate preparation. Unfortunately, the substrate handlers of single-sided polishing systems, used in manufacturing of semiconductor devices on Si substrates, are typically configured to polish only one side of a substrate surface, e.g., an active surface of the substrate having electronic devices formed thereon. Thus, to facilitate sequential single-sided polishing of the Si surface and then the C surface or vice versa, the SiC substrates are typically removed from the CMP systems after a first surface has been polished (either the Si surface or the C surface), reversed in their substrate holder, and returned to CMP system for polishing of a second surface (the remaining unpolished Si or C surface).

Reversing the orientation of SiC substrates in their substrate holder between sequential single-sided CMP processes is typically performed manually. Unfortunately, manual handling is labor-intensive and can result in undesirable errors and delays during processing and a corresponding increase in substrate processing costs associated therewith.

Accordingly, what is needed in the art are apparatus and methods for solving the problems above.

SUMMARY

The present disclosure generally relates to chemical mechanical polishing (CMP) systems and processes used in the manufacturing of electronic devices. In particular, the present disclosure relates to a substrate handling scheme for use with sequential single-sided CMP processing of opposite surfaces of a silicon carbide (SiC) substrate in a single-sided polishing system In one embodiment, a substrate polishing system includes a basin defining a substrate holding area, wherein the basin is sized to receive one or more substrate cassettes, and wherein each of the substrate cassettes is configured to hold a plurality of substrates. The system includes a substrate alignment station disposed in the substrate holding area, a plurality of polishing stations, each comprising a rotatable polishing platen, and a substrate carrier loading station. The system includes a plurality of substrate carriers suspended from a carriage assembly, wherein the carriage assembly is rotatable about a carriage axis to move individual ones of the plurality of substrate carriers between the plurality of polishing stations and the substrate carrier loading station, a substrate handler comprising an end effector having a first side and a second side that is opposite of the first side, and a computer readable medium having instructions stored thereon for a substrate processing method. The substrate processing method includes sequentially (a) urging a first surface of a substrate against one of a plurality of polishing pads, wherein the plurality of polishing pads are disposed on corresponding ones of the plurality of rotatable polishing platens; (b) transferring, using the first side of the end effector, the substrate from the substrate carrier loading station to the substrate alignment station; (c) transferring, using the first side of the end effector, the substrate from the substrate alignment station to the substrate carrier loading station; and (d) urging a second surface of the substrate against one of the plurality of polishing pads.

In another embodiment, a substrate processing method includes (a) urging a first surface of a substrate against one of a plurality of polishing pads, wherein the plurality of polishing pads are disposed on corresponding ones of a plurality of rotatable polishing platens; (b) transferring, using a first side of an end effector, the substrate from a substrate carrier loading station to a substrate alignment station; (c) transferring, using the first side of the end effector, the substrate from the substrate alignment station to the substrate carrier loading station; and (d) urging a second surface of the substrate against one of the plurality of polishing platens.

In yet another embodiment, a computer readable medium includes instructions stored thereon for a substrate processing method. The substrate processing method includes (a) urging a first surface of a substrate against one of a plurality of polishing pads, wherein the plurality of polishing pads are disposed on corresponding ones of a plurality of rotatable polishing platens; (b) transferring, using a first side of an end effector, the substrate from a substrate carrier loading station to a substrate alignment station; (c) transferring, using the first side of the end effector, the substrate from the substrate alignment station to the substrate carrier loading station; and (d) urging a second surface of the substrate against one of the plurality of polishing platens.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to chemical mechanical polishing (CMP) systems and processes used in the manufacturing of electronic devices. In particular, embodiments of the present disclosure relate to substrate flipping for sequential single-sided CMP polishing of a silicon carbide (SiC) substrate.

Figure 1A:
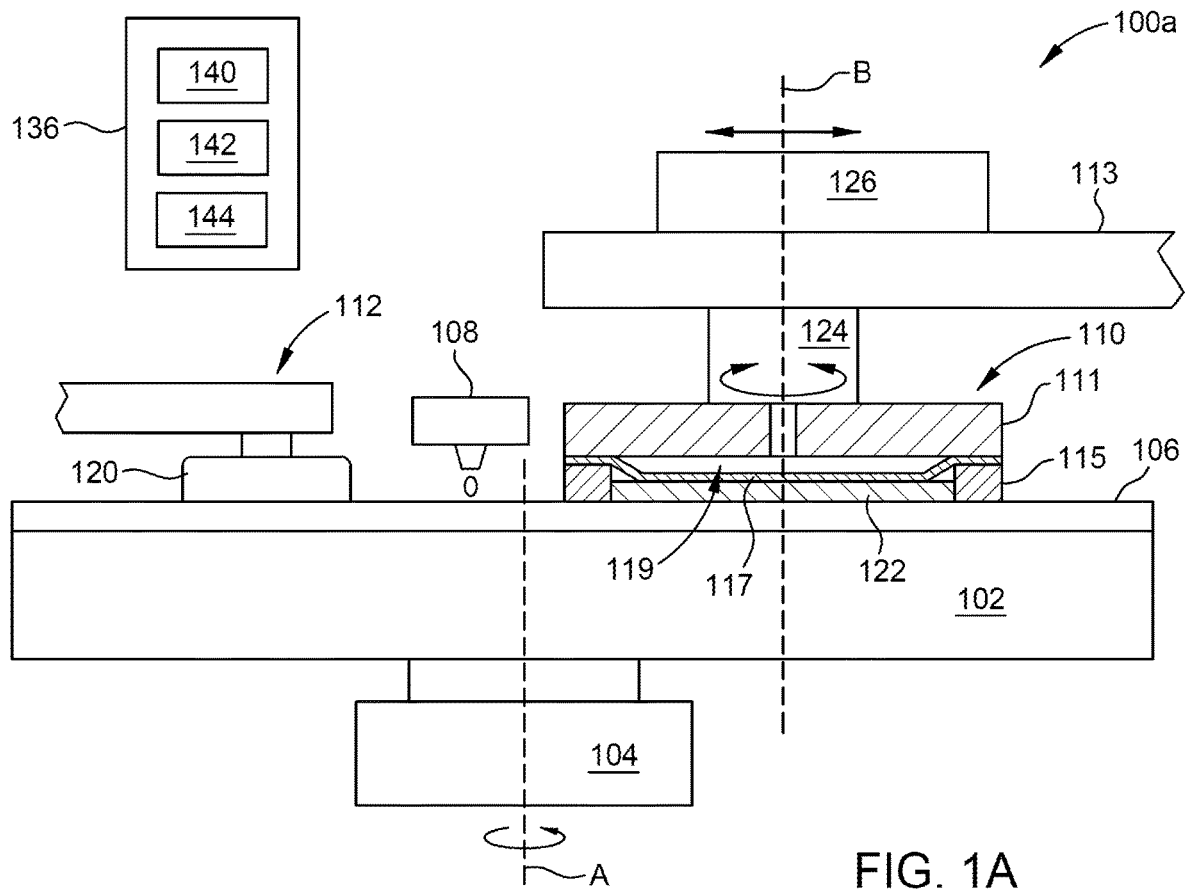
FIG. 1A is a schematic side view of an exemplary polishing station which may be used to practice the methods set forth herein, according to one embodiment.
Figure 1B:
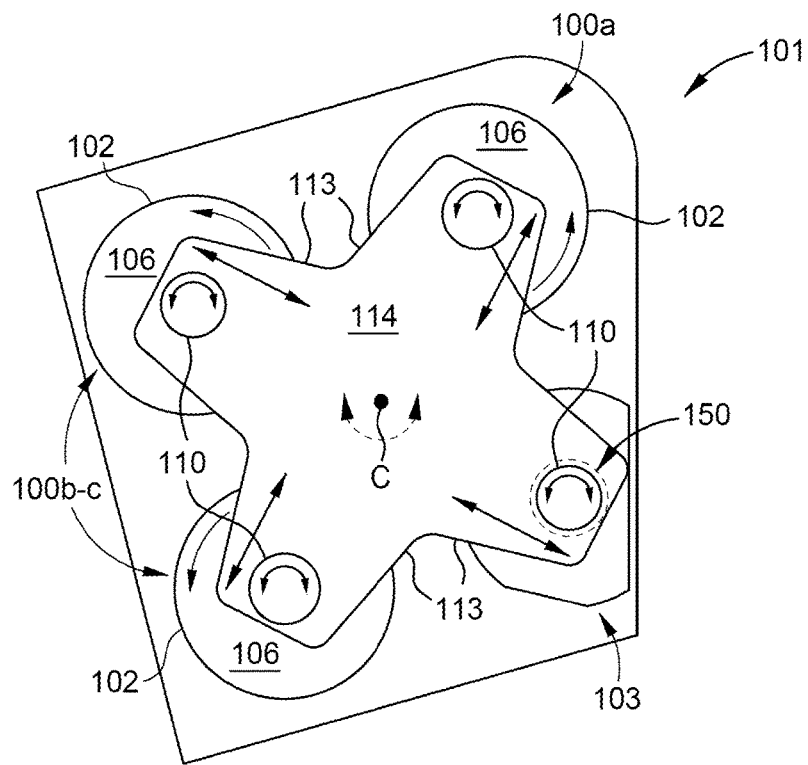
FIG. 1B is a schematic plan view of a portion of a multi-station polishing system which may be used to practice the methods set forth herein, according to one embodiment.

FIG. 1A is a schematic side view of a polishing station 100a, according to one embodiment, which may be used to practice the methods set forth herein. FIG. 1B is a schematic plan view of a portion of a multi-station polishing system 101 comprising a plurality of polishing stations 100a-c, where each of the polishing stations 100b-c are substantially similar to the polishing station 100a described in FIG. 1A. In FIG. 1B at least some of the components with respect to the polishing station 100a described in FIG. 1A are not shown on the plurality of polishing stations 100a-c in order to reduce visual clutter.

As shown in FIG. 1A, the polishing station 100a includes a platen 102, a first actuator 104 coupled to the platen 102, a polishing pad 106 disposed on the platen 102 and secured thereto, a fluid delivery arm 108 disposed over the polishing pad 106, a substrate carrier 110 (shown in cross-section), and a pad conditioner assembly 112. Here, the substrate carrier 110 is suspended from a carriage arm 113 of a carriage assembly 115 (FIG. 1B) so that the substrate carrier 110 is disposed over the polishing pad 106 and faces there towards. The carriage assembly 115 is rotatable about a carriage axis C to move the substrate carrier 110, and thus a substrate 122 chucked therein, between a substrate carrier loading station 103 (FIG. 1B) and/or between polishing stations 100a-c of the multi-station polishing system 101. The substrate carrier loading station 103 includes a load cup 150 (shown in phantom) for loading a substrate 122 to the substrate carrier 110.

During substrate polishing, the first actuator 104 is used to rotate the platen 102 about a platen axis A and the substrate carrier 110 is disposed above the platen 102 and faces there towards. The substrate carrier 110 is used to urge a to-be-polished surface of a substrate 122 (shown in phantom), disposed therein, against the polishing surface of the polishing pad 106 while simultaneously rotating about a carrier axis B. Here, the substrate carrier 110 includes a housing 111, an annular retaining ring 115 coupled to the housing 111, and a membrane 117 spanning the inner diameter of the retaining ring 115. The retaining ring 115 surrounds the substrate 122 and prevents the substrate 122 from slipping from the substrate carrier 110 during polishing. The membrane 117 is used to apply a downward force to the substrate 122 and for loading (chucking) the substrate into the substrate carrier 110 during substrate loading operations and/or between substrate polishing stations. For example, during polishing, a pressurized gas is typically provided to a carrier chamber 119 to exert a downward force on the membrane 117 and thus a downward force on the substrate 122 in contact therewith. Before and after polishing, a vacuum may be applied to the chamber 119 so that the membrane 117 is deflected upwards to create a low pressure pocket between the membrane 117 and the substrate 122, thus vacuum-chucking the substrate 122 into the substrate carrier 110.

The substrate 122 is urged against the pad 106 in the presence of a polishing fluid provided by the fluid delivery arm 108. Typically, the rotating substrate carrier 110 oscillates between an inner radius and an outer radius of the platen 102 to, in part, reduce uneven wear of the surface of the polishing pad 106. Here, the substrate carrier 110 is rotated using a first actuator 124 and is oscillated using a second actuator 126.

Here, the pad conditioner assembly 112 comprises a fixed abrasive conditioning disk 120, e.g., a diamond impregnated disk, which may be urged against the polishing pad 106 to rejuvenate the surface thereof and/or to remove polishing byproducts or other debris therefrom. In other embodiments, the pad conditioner assembly 112 may comprise a brush (not shown).

Here, operation of the multi-station polishing system 101 and/or the individual polishing stations 100a-c thereof is facilitated by a system controller 136 (FIG. 1A). The system controller 136 includes a programmable central processing unit (CPU 140) which is operable with a memory 142 (e.g., non-volatile memory) and support circuits 144. The support circuits 144 are conventionally coupled to the CPU 140 and comprise cache, clock circuits, input/output subsystems, power supplies, and the like, and combinations thereof coupled to the various components of the polishing system 101, to facilitate control of a substrate polishing process. For example, in some embodiments the CPU 140 is one of any form of general purpose computer processor used in an industrial setting, such as a programmable logic controller (PLC), for controlling various polishing system component and sub-processors. The memory 142, coupled to the CPU 140, is non-transitory and is typically one or more of readily available memory such as random access memory (RAM), read only memory (ROM), floppy disk drive, hard disk, or any other form of digital storage, local or remote.

Herein, the memory 142 is in the form of a computer-readable storage media containing instructions (e.g., non-volatile memory), that when executed by the CPU 140, facilitates the operation of the polishing system 101. The instructions in the memory 142 are in the form of a program product such as a program that implements the methods of the present disclosure (e.g., middleware application, equipment software application etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 1C:
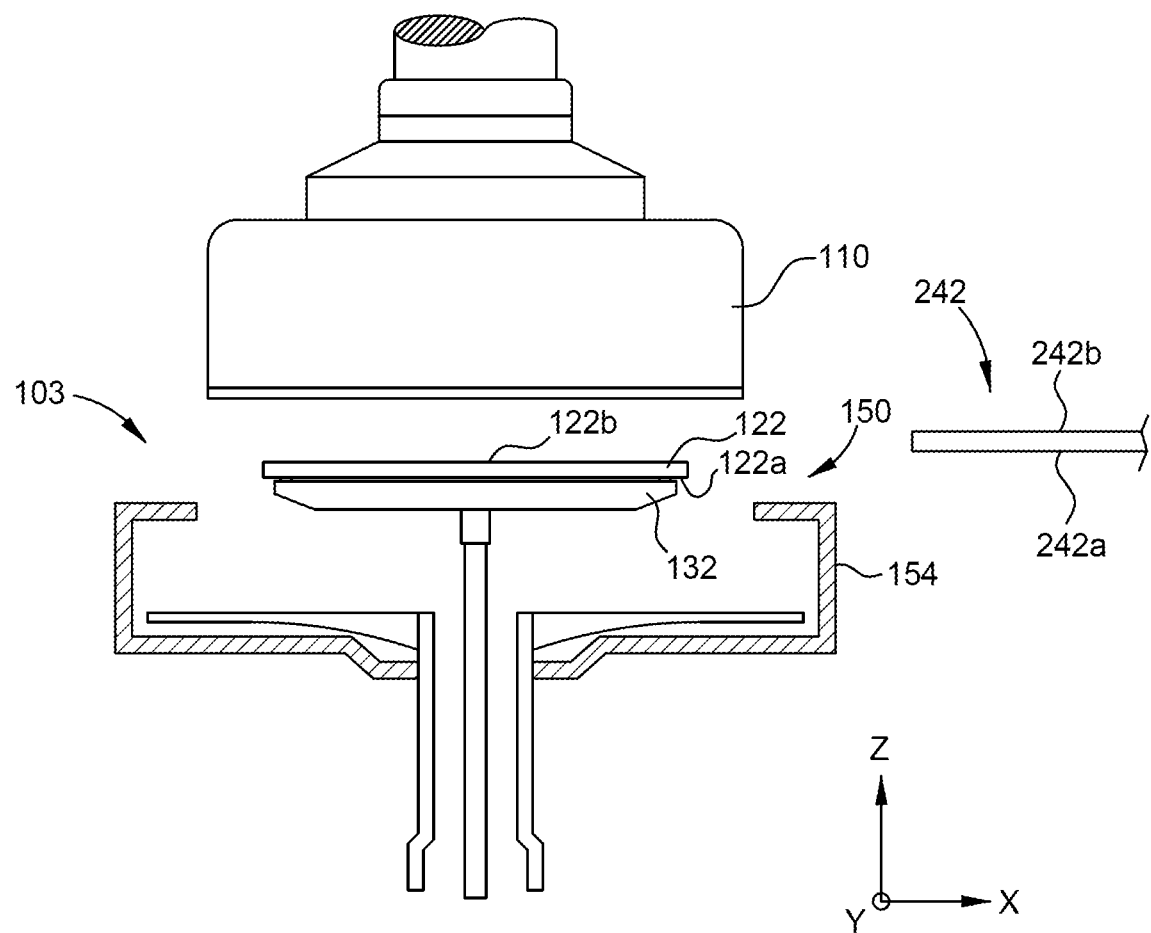
FIG. 1C is a schematic side sectional view of the substrate carrier loading station of FIG. 1B, according to one embodiment.

FIG. 1C is a schematic side sectional view of the substrate carrier loading station 103 of FIG. 1B, according to one embodiment. As shown in FIG. 1C, the load cup 150 includes a pedestal 152 for loading a to-be-polished substrate 122 disposed thereon into a substrate carrier 110 and for unloading a polished substrate 122 therefrom. The pedestal 152 is movable in the Z-direction, i.e., toward and away from the substrate carrier 110 disposed thereabove. Here, the load cup 150 includes a shroud 154 that surrounds the pedestal 152. In some embodiments, the load cup 150 further includes one more nozzles (not shown) positioned radially inward of the pedestal 152 to direct a cleaning fluid, e.g., deionized water, towards the surfaces of the substrate carrier 110 to remove polishing fluid accumulated thereon.

Herein, the substrate 122 is transferred to and from the pedestal 152 in a surface-to-be-polished face down orientation. For example, here a to-be-polished first surface 122a of the substrate 122 is contacting the pedestal 152 and thus faces theretowards and a second surface 122b of the substrate 122, opposite of the first surface, is facing away from the pedestal 152 and towards the substrate carrier 110.

In some embodiments, the substrate 122 may be a crystalline silicon carbide (SiC) substrate where the first surface 122a is a silicon terminated surface (Si surface) and the second surface 122b is a carbon terminated surface (C surface) or vice versa. In those embodiments, the first surface 122a may be polished first by loading the substrate 122 so that the first surface 122a is in a "face down orientation", i.e., in contact with a substrate carrier facing surface of the pedestal 152. Here, the substrate 122 is transferred to the substrate carrier loading station 103 using an end effector 242 of a substrate handling system 200 (shown in FIG. 2). The pedestal 152 is then raised and/or the substrate carrier 110 is lowered and the substrate 122 is vacuum chucked into the substrate carrier 110. The substrate carrier 110 is used to move the substrate 122 between one or more polishing stations 100a-c and to urge the first surface 122a of the substrate 122 against one or more of the polishing pads 106 thereof.

Once the first surface 122a has been polished, the substrate carrier 110 is returned to a position over the substrate carrier loading station 103, and the substrate 122 is transferred from the substrate carrier 110 to the surface of the pedestal 152 in the first surface face down orientation. Typically, polishing the second surface 122b of the substrate 122 includes reversing or flipping the orientation of the substrate 122 so that the second surface 122b is in a face down orientation with respect to the pedestal 152. For example, the substrate 122 may be flipped such that the first surface 122a is facing the substrate carrier 110 and the second surface 122b is contacting the pedestal 152. After flipping the substrate 122, the substrate 122 is loaded into the substrate carrier 110 in a second surface face down orientation so that the second surface 122b may be polished at one or more of the polishing stations 100a-c. A method for reversing the orientation of the substrate 122, i.e., flipping the substrate 122, to facilitate sequential single-sided polishing of the first surface 122a and the second surface 122b is set forth in FIG. 4.

Figure 2A:
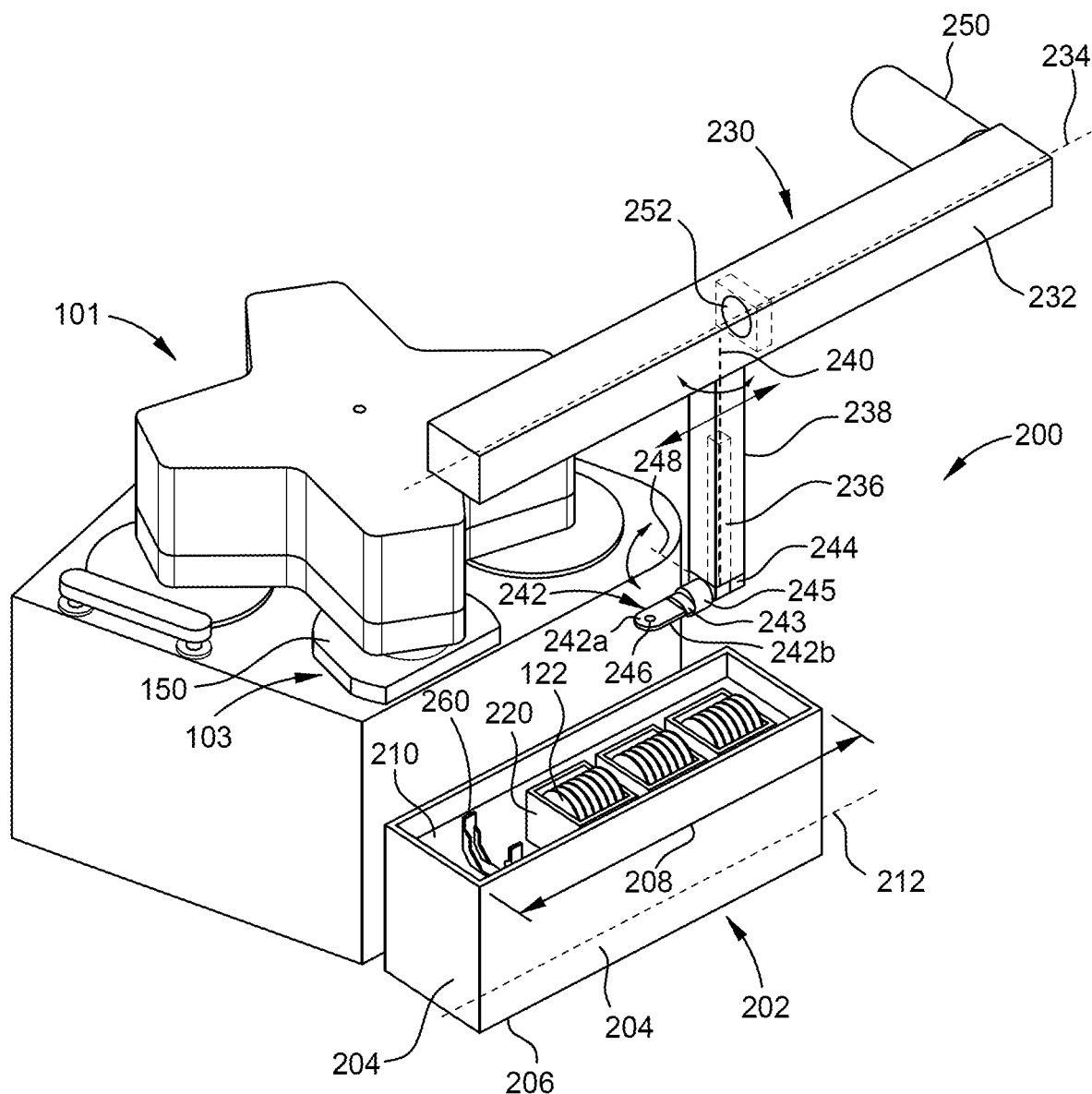
FIG. 2A is a schematic isometric view of the multi-station polishing system of FIG. 1B and further includes a substrate handling system which may be used to practice the methods set forth herein, according to one embodiment.

FIG. 2A is a schematic isometric view of the multi-station polishing system 101 further illustrating a substrate handling system 200 which may be used to practice the methods set forth herein, according to one embodiment. As shown in FIG. 2A, the substrate handling system 200 generally includes a basin 202, a substrate handler assembly 230, and an alignment station 260. The basin 202 features walls 204 and a base 206 which define a substrate holding area 208 sized to contain a plurality of substrate transport containers, e.g., cassettes 220. When in use, the basin 202 typically contains a fluid 210, such as deionized water, and the one or more cassettes 220 disposed in the substrate holding area 208 are submerged in the fluid 210. Here, the fluid 210 is used to keep to-be-polished substrates and the polished substrates wet between processing operations and to prevent polishing fluids from drying thereon before the substrates can be removed for post-CMP cleaning in a stand-alone post-CMP cleaning system (not shown). The one or more cassette 220 are aligned along a first longitudinal axis 212 of the basin 202. Herein, each cassette 220 is configured to hold a plurality of substrates 122 for processing in the polishing system 101. For example, for a CMP system configured to polish 200 mm diameter substrates, each cassette 220 is typically configured to hold about 25 substrates.

The substrate handler assembly 230 includes an overhead track 232 disposed above the basin 202. Here, the overhead track 232 is oriented along a second axis 234 that is substantially parallel to the first axis 212 of the basin 202. In one or more embodiments, the overhead track 232 may be oriented horizontally, i.e., the second axis 234 is orthogonal to the direction of gravity. The substrate handler assembly 230 further includes an arm 236 that is at least partially disposed inside a housing 238 where the housing 238 guides the arm 236 which is movable in the Z-direction. For example, here the arm 236 may be moved along a third axis 240 towards and away from the basin 202, where the third axis 240 is orthogonal to the second axis 234 of the overhead track 232. The arm 236 is extendable, with respect to the housing 238, toward and away from the basin 202 along the third axis 240. In one or more embodiments, the arm 236 may be oriented vertically, i.e., parallel to the direction of gravity.

Here, the substrate handling system 200 further includes the end effector 242 which is coupled to a first or lower end of the arm 236 by a wrist assembly 244. The substrate handling system 200 further includes a blade mount 243 and a rotary actuator 245 coupled between the end effector 242 and the wrist assembly 244. In one embodiment, the end effector 242 is a vacuum blade having a port 246 formed in a substrate handling surface, here a first side 242a, thereof. The port 246 is fluidly coupled to a low-pressure pump (not shown) for applying a vacuum pressure through the port 246. The vacuum pressure is used to engage a surface of a substrate 122 when the substrate handling surface, here the first side 242a, of the end effector 242 is brought into proximity or contact therewith. For example, the end effector 242 may be lowered into the substrate holding area 208 and disposed adjacent a substrate 122 held in one of the cassettes 220. In this position, the vacuum pressure may be applied to engage a surface of the substrate 122 to the first side 242a of the end effector 242. Typically, the substrates 122 are disposed in a substantially vertical orientation in the cassettes 220 when the cassettes 220 are disposed in the basin 202, where substantially vertical is within about 20° of the direction of gravity. The first side 242a, of the end effector 242 is typically parallel to the surface of the substrate 122 to facilitate vacuum engagement therebetween. Thus, when the arm 236 is raised upwardly and away from the cassettes 220, the end effector 242 and the substrate 122 vacuum engaged therewith are disposed in a substantially vertical orientation. Here, the wrist assembly 244, alone or in combination with the arm 236, provides at least one degree of movement to the end effector 242. The degree of movement is in addition to the vertical translation provided by the arm 236 as it is extended toward or away from the basin 202 (described above) or the rotation of the arm 236 provided by a second actuator 252 (described below). The at least one degree of movement is schematically illustrated in FIG. 2B.

Figure 2B:
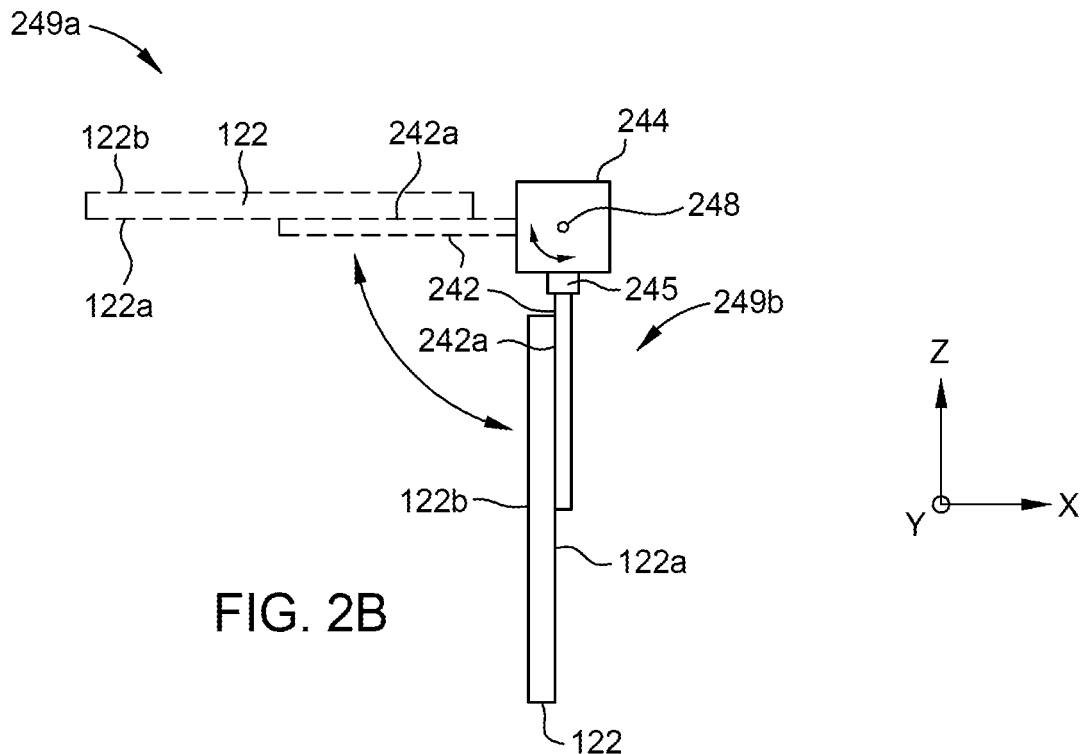
FIGS. 2B-2D schematically illustrate the degrees of motion of an end effector of the substrate handling system of FIG. 2A, according to one embodiment.

FIG. 2B shows the degree of movement which is used to move the end effector 242 from the vertical or substantially vertical orientation to a horizontal orientation. The vertical or substantially vertical orientation is used to transfer the substrate 122 to and from the cassette 220 and/or to and from the substrate alignment station 260. The horizontal orientation is used to position the substrate 122 on the pedestal 152 or remove the substrate 122 therefrom. For example, in FIG. 2B, wrist assembly 244 is configured to move the end effector 242 about a fourth axis 248, and thus swing a substrate 122 secured thereto, between a first position 249a and a second position 249b. Here, the fourth axis 248 is orthogonal to the third axis 240 of the arm 236. In one or more embodiments, the fourth axis 248 may be oriented horizontally. In the first position 249a, the first side 242a of the end effector 242 is parallel to the first axis 212 of the basin 202 and/or the second axis 234 of the overhead track 232. In the second position 249b, the first side 242a of the end effector 242 is parallel to the third axis 240 of the arm 236 such that the end effector 242 extends from the arm 236 towards the basin 202. In the second position 249b, the end effector 242 is positioned to be lowered into the basin 202 to vacuum engage a substrate 122 as described above.

Figure 2C:
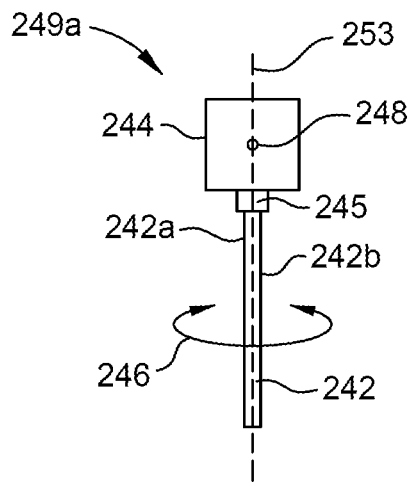
Figure 2D:
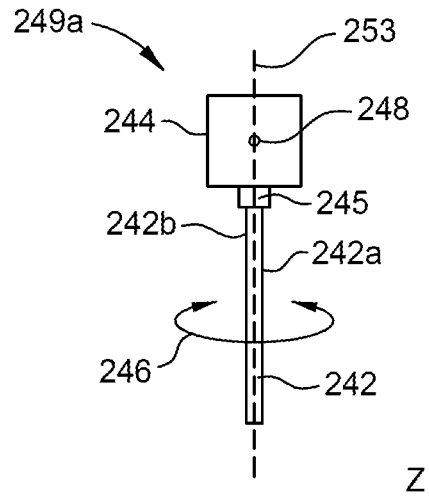

Here, the rotary actuator 245, alone or in combination with the blade mount 243, provides at least one degree of movement to the end effector 242. The degree of movement is in addition to the vertical translation provided by the arm 236 as it is extended toward or away from the basin 202 (described above) or the rotation of the arm 236 provided by a second actuator 252 (described below) or the movement of the end effector 242 about the fourth axis 248 provided by the wrist assembly 244 (described above). The at least one degree of movement is schematically illustrated in FIGS. 2C-2D. FIGS. 2C-2D show the degree of motion which is used to rotate or pivot the end effector 242 about a fifth axis 253 between a first orientation 251a shown in FIG. 2C and a second orientation 251b shown in FIG. 2D. Here, the fifth axis 253 is orthogonal to the fourth axis 248 of the wrist assembly 244. In one or more embodiments, the fifth axis 253 may be oriented vertically. Here, the rotary actuator 245 is configured to rotate the end effector 242 about the fifth axis 253 by about 180° to reverse an orientation of the end effector first and second sides 242a, 242b. For example, in the first orientation 251a, the end effector first side 242a is facing the −X direction and the end effector second side 242b is facing the +X direction. However, in the second orientation 251b, the end effector 242 orientation is reversed such that the end effector first side 242a is facing the +X direction and the end effector second side 242b is facing the −X direction. In some other embodiments, the rotary actuator 245 may be configured to rotate or pivot the end effector 242 about the fifth axis 253 by about 180° or more, such as from about 180° to about 360°. In some embodiments, the rotary actuator 245 may rotate or pivot the end effector 242 clockwise, counterclockwise, or both.

Here, the substrate handler assembly 230 further includes a first actuator 250 for moving the arm 236 along the overhead track 232. Typically, the substrate handler assembly 230 includes the second actuator 252, such as a drive assembly, for rotating the arm 236 about the third axis 240 to facilitate positioning of the substrate 122 on the pedestal 152 of the substrate carrier loading station 103. In some embodiments, the second actuator 252 is coupled to the first actuator 250 so that the second actuator 252 moves with the arm 236 along the overhead track 232.

The alignment station 260 is disposed in the basin 202 in alignment with the plurality of cassettes 220 along the first axis 212. The alignment station 260 is positioned and oriented to receive a substrate 122 from the end effector 242 when the end effector 242, and thus the substrate 122, are disposed in the second position 249b. Here, the alignment station 260 is disposed in the substrate holding area 208, being submerged in the fluid 210. Alternatively, the alignment station 260 may be positioned outside the substrate holding area 208. The alignment station 260 is used to temporarily hold a substrate 122 to facilitate the method 400 of FIG. 4. For example, here alignment station 260 is used to support reversal or flipping the substrate orientation between polishing of the first surface 122a and polishing of the second surface 122b. Reversing or flipping the substrate orientation typically includes positioning the substrate in the alignment station 260 using the end effector 242 which is disposed in a first orientation 251a, disengaging the first or second surface 122a or 122b of the substrate 122 from the end effector 242, rotating or pivoting the end effector 242 180° about the fifth axis 253 to position the end effector in the second orientation, and subsequently re-engaging the opposite surface (122a or 122b) of the substrate 122 by the end effector 242.

Figure 3:
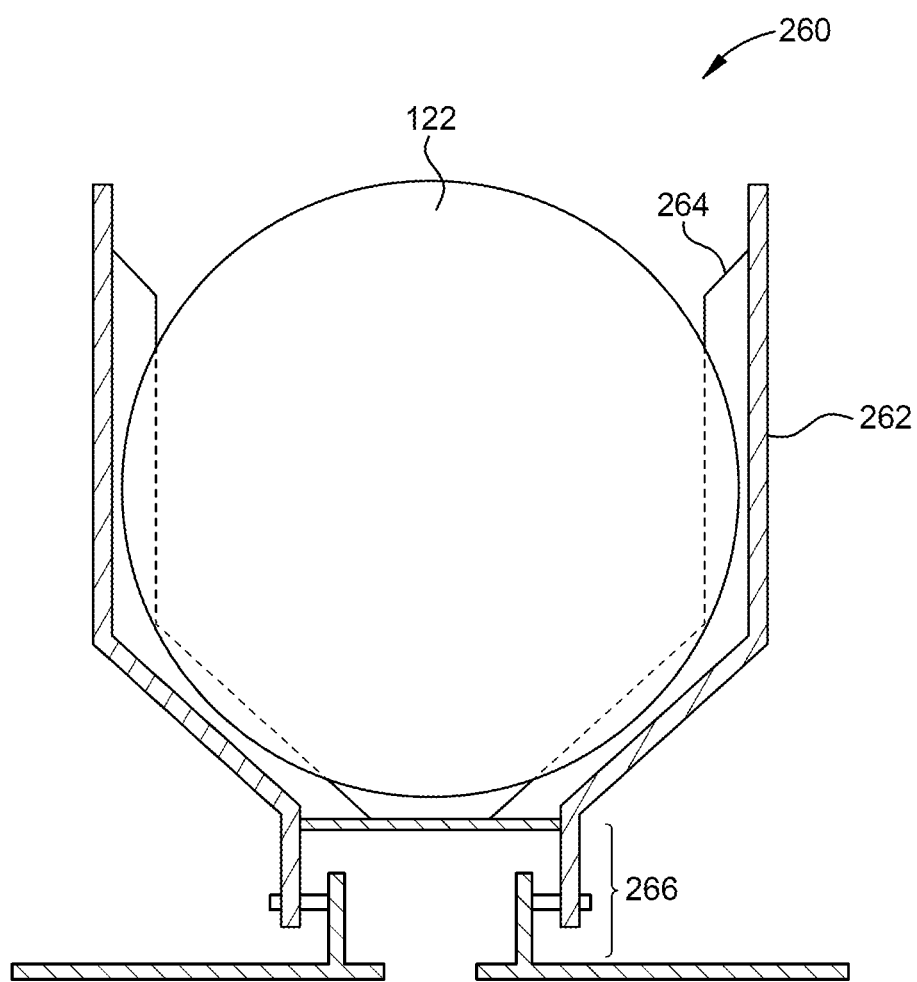
FIG. 3 is a schematic side sectional view of the substrate alignment station which may be used with the substrate handing system of FIG. 2, according to one embodiment.

FIG. 3 is a schematic side sectional view of the substrate alignment station 260 which may be used with the substrate handing system 200 of FIG. 2, according to one embodiment. As shown in FIG. 3, the alignment station 260 includes a frame 262 having end flanges 264. The frame 262 is shaped to support the substrate in an upright and/or substantially vertical orientation. The frame 262 is closed at a bottom end thereof to support the substrate 122. The frame 262 is open at a top end thereof to allow the substrate 122 to be removed from and inserted into the frame 262 from above. The end flanges 264 enclose a periphery portion of the frame 262. It will be appreciated that the end flanges 264 are configured to support the substrate 122 in an upright orientation without actually gripping the substrate 122. Therefore, the end flanges 264 are shaped to support edges of the substrate 122. Alternatively, the frame 262 may include a slot in the bottom end thereof for receiving the substrate 122, and the end flanges 264 may be omitted. In some other embodiments, the frame 262 and/or the end flanges 264 may be shorter, for example enveloping about the lower ¾ of the substrate 122 or less, such as about the lower half of the substrate 122 or less, such as about the lower quarter of the substrate 122 or less. In some embodiments, the frame 262 may be attached to a base 266 for affixing the alignment station 260 to the substrate handling system 200 (e.g., in the substrate holding area 208).

Figure 4:
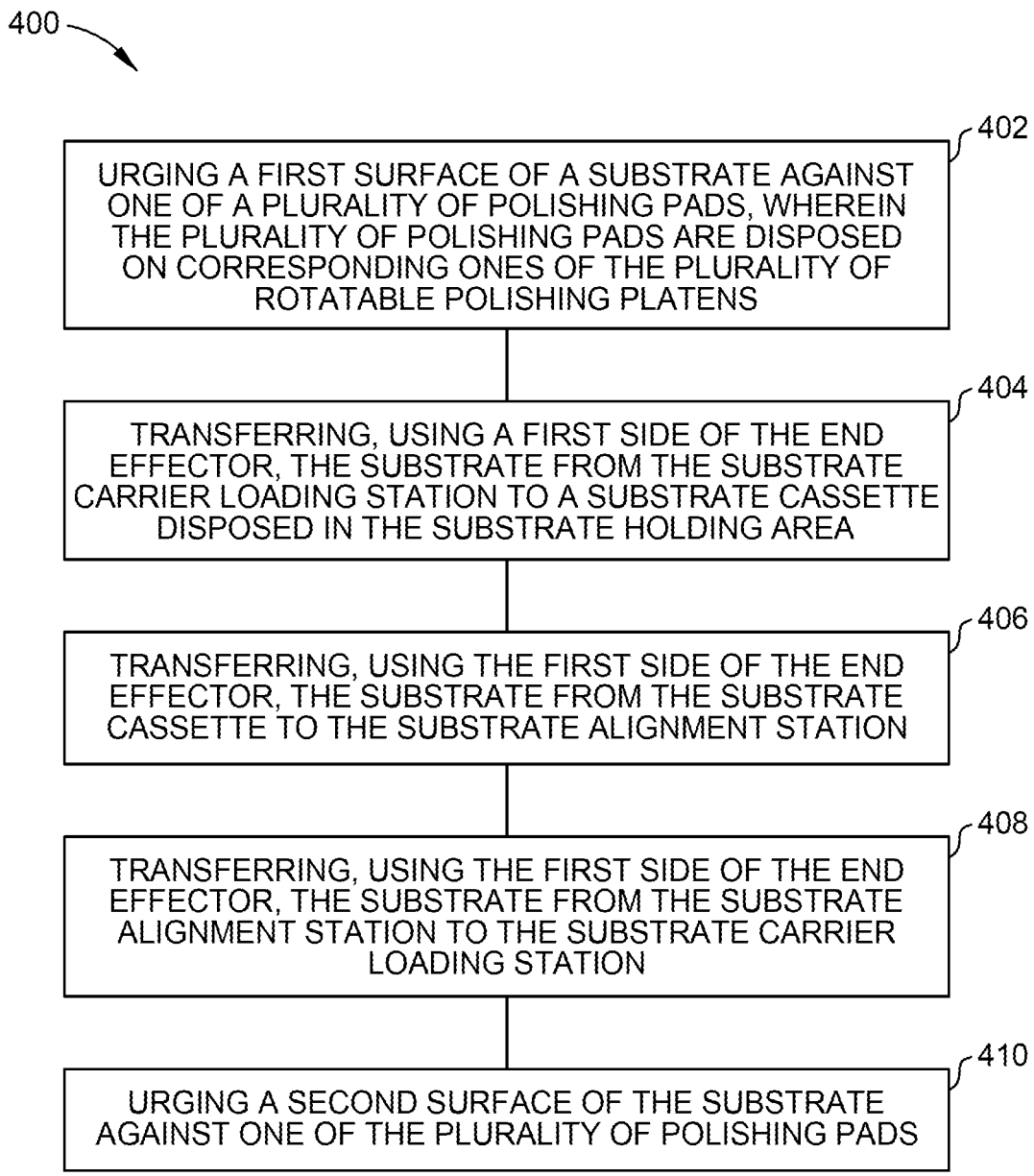
FIG. 4 is a diagram illustrating a method for processing a substrate, according to one embodiment.

FIG. 4 is a diagram illustrating a method 400 for processing a substrate 122, according to one embodiment. FIGS. 5A-5E are used to illustrate aspects of the method 400 of FIG. 4, according to one embodiment. In some embodiments, one or more activities of the method 400 are stored as instructions in the computer readable medium of the system controller 136. Generally, the method 400 includes polishing a first surface 122a of a substrate 122, reversing the orientation of the substrate 122, i.e., flipping the substrate 122, using the substrate handling system 200, and polishing a second surface 122b of the substrate 122. Beneficially, the method 400 is performed without removing the substrate 122 from the polishing system 101.

Figure 5A:
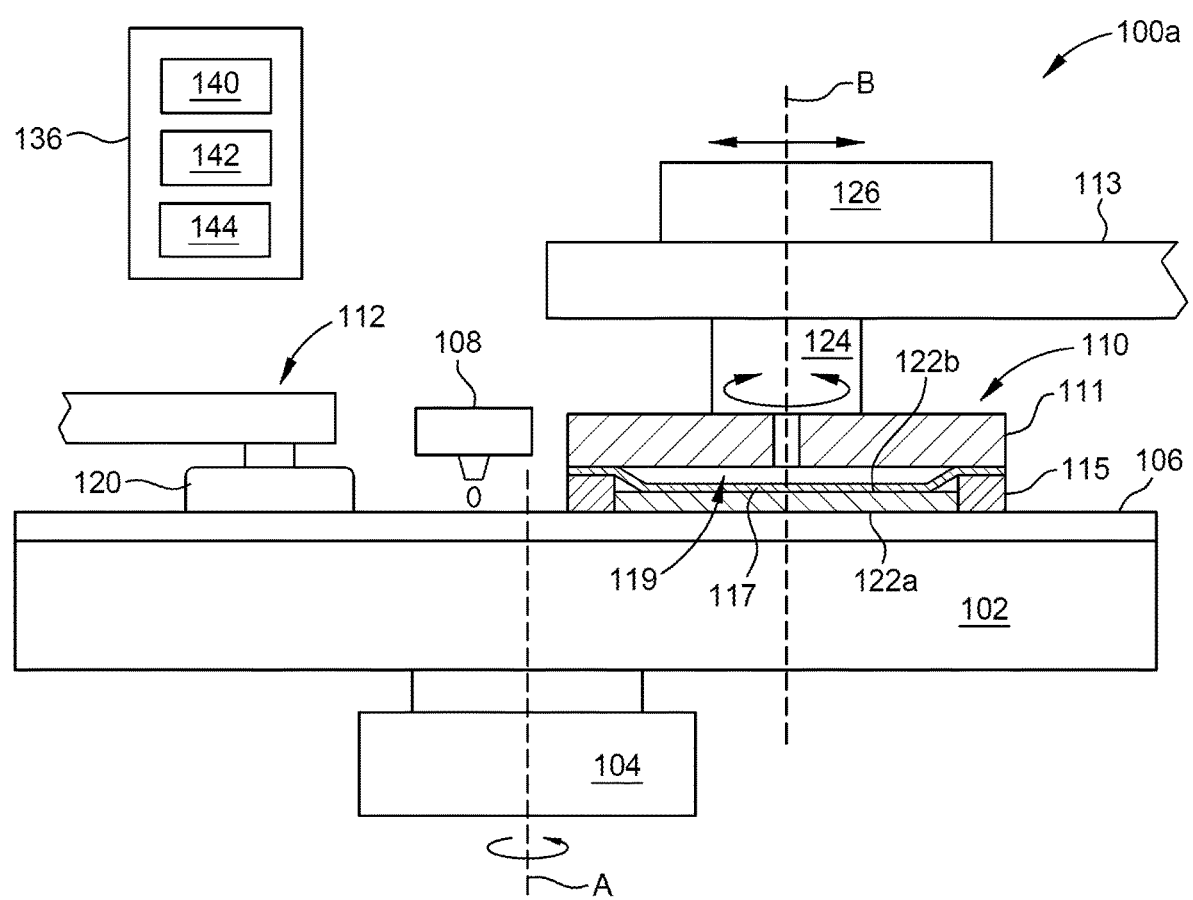
FIG. 5A is a schematic side view of a polishing station which may be used to practice the method of FIG. 4, according to one embodiment.

At activity 402, the method 400 includes urging a first surface 122a of a substrate 122 against one of a plurality of polishing pads 106, wherein the plurality of polishing pads 106 are disposed on corresponding ones of the plurality of rotatable polishing platens 102. Urging the first surface 122a of the substrate 122 against a polishing pad 106 is shown in FIG. 5A. Here, the substrate carrier 110 engages a second (opposite) surface 122b of the substrate 122 during the urging, e.g., the second surface 122b is in contact with the membrane 117.

Figure 5B:
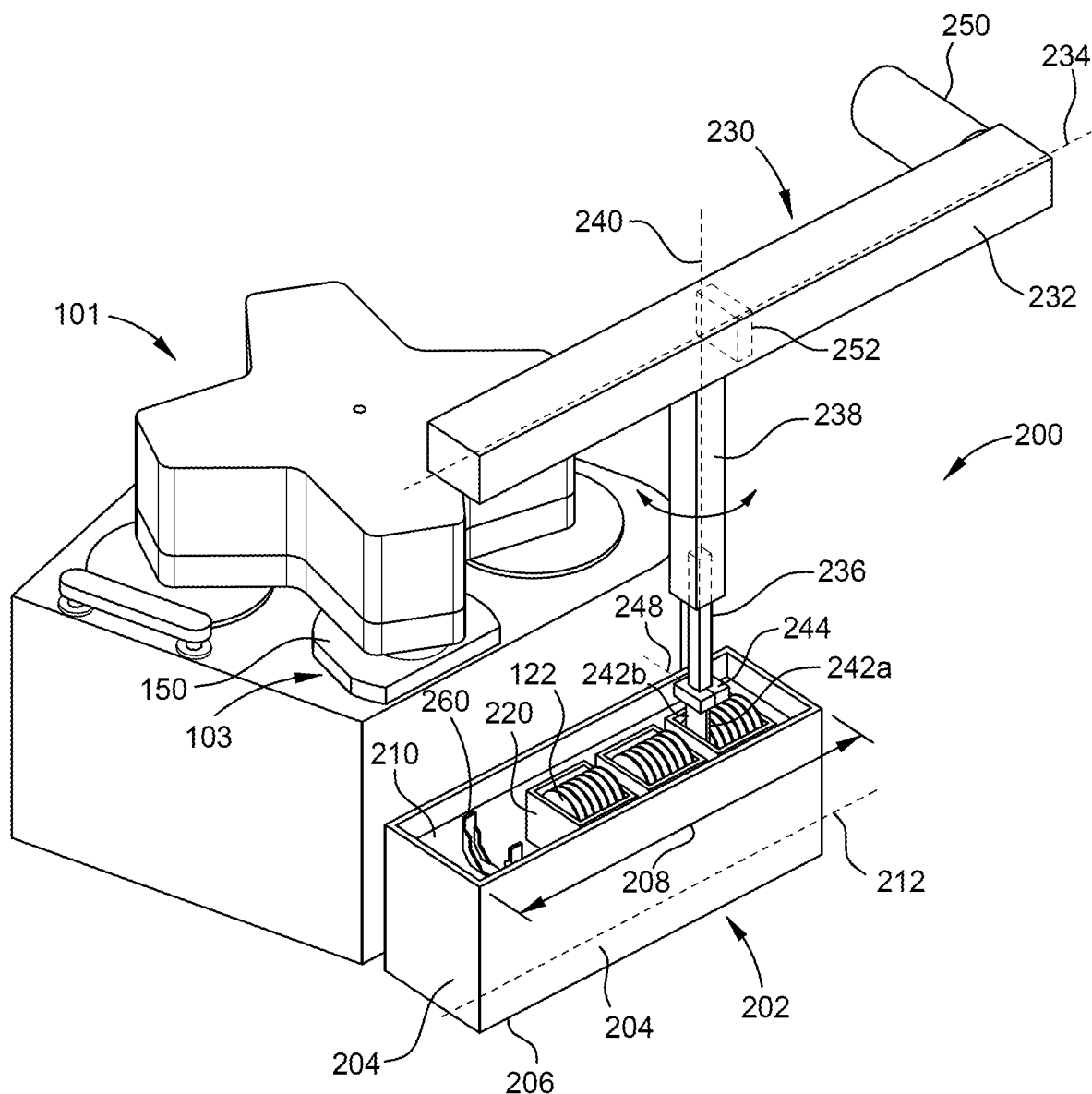
FIGS. 5B-5D are schematic isometric views of the multi-station polishing system of FIG. 2 and illustrate various aspects of the method set forth in FIG. 4, according to one embodiment.

At activity 404, the method 400 includes transferring, using a first side 242a of the end effector 242, the substrate 122 from the substrate carrier loading station 103 to a substrate cassette 220 disposed in the substrate holding area 208. Here, the first side 242a of the end effector 242 engages the second surface 122b of the substrate 122 during the transferring. The end effector 242 has a second side 242b facing opposite the first side 242a. FIG. 5B shows the substrate 122 being transferred to the substrate cassette 220.

Transferring the substrate 122 from the substrate carrier loading station 103 to the substrate cassette 220 at activity 404 typically includes engaging the end effector 242 to the substrate 122 which is positioned on the pedestal 152. To position the substrate 122 on the pedestal, the substrate 122 is transferred from the substrate carrier 110 to the load cup 150 of the substrate carrier loading station 103 (FIG. 1C). Here, the substrate carrier 110 is moved about the carriage axis C to position the substrate carrier 110 above the substrate carrier loading station 103. One or both of the pedestal 152 and the substrate carrier 110 are moved relative to one another to transfer the substrate 122 therebetween. For example, here the first surface 122a of the substrate 122 is brought into contact with the pedestal 152 and is transferred thereto by disengaging the second surface 122b of the substrate 122 from the substrate carrier 110. One or both of the load cup 150 and the substrate carrier 110 are then moved relative to one another to form a gap between the substrate 122 and the substrate carrier 110 to facilitate access to the substrate 122 by the end effector 242.

Engaging the end effector 242 to the substrate 122 includes rotating the arm 236 about the third axis 240 to swing the end effector 242, disposed in a generally horizontal position, into the gap between the substrate carrier 110 and the pedestal 150 having the substrate 122 disposed thereon. One or both of the end effector 242 and the pedestal 152, and the substrate 122 disposed thereon, are then moved relative to one another, i.e., towards one another, to bring the second surface 122b of the substrate 122 into contact with the first side 242a of the end effector 242.

After engaging the end effector 242 to the substrate 122, the arm 236 is rotated about the third axis 240 to swing the end effector 242, and the substrate 122 engaged thereto, to the first position 249a (FIG. 2A shows the first position 249a without a substrate 122 disposed on the end effector). In the first position 249a, the end effector 242 and the substrate 122 are disposed above the substrate holding area 208. Typically, the arm 236 is moved along the overhead track 232 to position the end effector 242, and thus the substrate 122 engaged thereto, above a desired "open" position of the cassette 220, i.e., with a desired slot in the cassette 220 for the substrate 122 to be transferred into. Aligning substrate 122 with the desired open position in the cassette 220 further includes swinging the end effector 242 about the fourth axis 248 of the wrist assembly 244 to the second position 249*b* such that the end effector 242 and the substrate 122 are positioned to be lowered into the substrate holding area 208. Once the substrate 122 is aligned with the desired open position, the arm 236 is extended toward the cassette 220 along the third axis 240 to position the substrate 122 therein. Once the substrate 122 is positioned in the desired opening in the cassette 220, the substrate 122 is disengaged from the end effector 242 by releasing the vacuum therebetween and the end effector 242 is removed from the cassette by upwardly retracting the arm 236.

At activity 406, the method 400 includes transferring, using the first side 242*a* of the end effector 242, the substrate 122 from the substrate cassette 220 to the substrate alignment station 260. Here, the first side 242*a* of the end effector 242 engages the second surface 122*b* of the substrate 122 during the transferring.

Transferring the substrate 122 from the substrate cassette 220 to the substrate alignment station 260 at activity 406 typically includes engaging the end effector 242 to the substrate 122 which is positioned in the substrate cassette 220 (see FIG. 5B). Here, the first surface 122*a* of the substrate 122 is a device side surface that will have electronic devices manufactured thereon and the second surface 122*b* is a non-device side surface, or back side surface. Generally, when picking a substrate 122 from, and returning the substrate to, the substrate cassette 220, the end effector 242 only engages with the second surface 122*b* to avoid substrate handling induced defects, e.g., scratches on the device side surface. Reversing the orientation of the substrate 122 to facilitate sequential polishing of the two substrate surfaces requires engaging the end effector 242 to each surface. Thus, the non-device surface, or second surface 122*b* is typically polished first so that any surface damage caused by the end effector 242 to the first surface 122*a* can be removed during the polishing thereof.

Figure 5C:
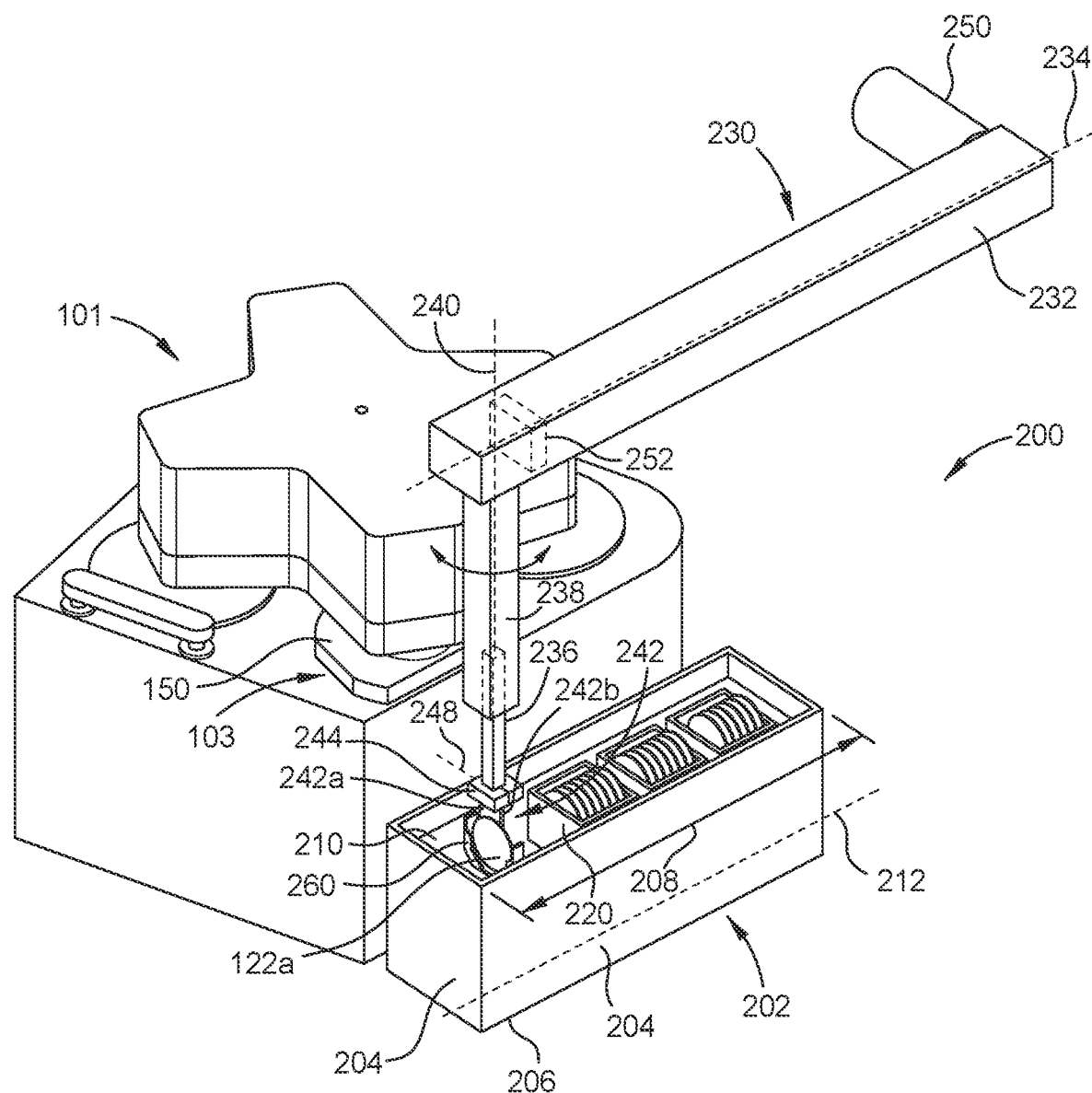

Generally, the substrate cassette 220 is seated in the basin 202 so that the substrates 122 are tilted in the −x direction from about 3° to about 5° relative to vertical. As shown in FIG. 5B, the first surface 122*a* of the substrates 122 are facing the +x direction and the second surface 122*b* the substrates 122 are facing the −x direction. Therefore, the substrates 122 are picked up from the second surface 122*b*, which is the side facing the −x direction. After engaging the second surface 122*b* of the substrate 122 in the substrate cassette 220, the arm 236 is retracted away from the cassette 220 along the third axis 240. In some embodiments, the end effector 242 is rotated or pivoted about the fifth axis 253, using the rotary actuator 245, from the second orientation 251*b* (FIG. 2D) to the first orientation 251*a* (FIG. 2C). In some embodiments, the end effector 242 is moved about the fourth axis 248, using the wrist assembly 244, to an intermediate position between the first and second positions 249*a*, 249*b* (FIG. 2B) prior to rotating the end effector 242 about the fifth axis 253. Here, the arm 236 is moved along the overhead track 232 to position the arm 236 over the substrate alignment station 260 and thus align the substrate 122 therewith. The arm 236 is then extended towards the substrate alignment station 260 along the third axis 240 to position the substrate 122 in the frame 262 as shown in FIG. 5C. In this position, the first side 242*a* of the end effector 242 is facing the second surface 122*b* of the substrate 122. Once the substrate 122 is positioned in the frame 262, the first side 242*a* of the end effector 242 is disengaged from the substrate 122, and the arm 236 is retracted upwardly toward the overhead track 232.

In some embodiments, the substrate 122 is transferred, using the first side 242*a* of the end effector 242, from the substrate carrier loading station 103 to the substrate alignment station 260 without transferring the substrate 122 to the substrate cassette 220, e.g., when the first surface 122*a* of the substrate 122 is to be polished.

Figure 5D:
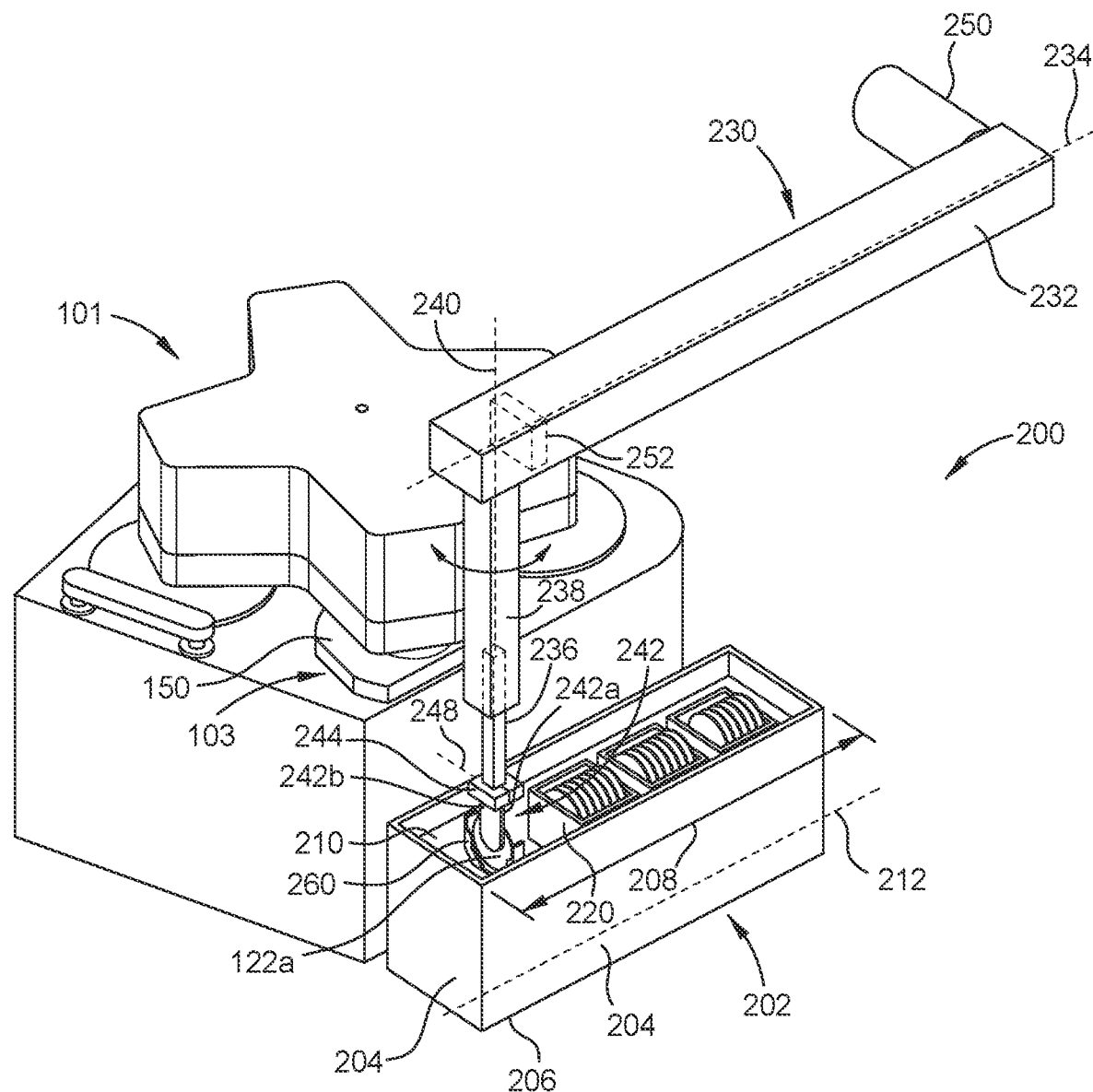

At activity 408, the method 400 includes transferring, using the first side 242*a* of the end effector 242, the substrate 122 from the substrate alignment station 260 to the substrate carrier loading station 103. Here, transferring the substrate 122 from the substrate alignment station 260 to the substrate carrier loading station 103 includes changing the orientation of the end effector 242 with respect to the substrate 122 such that the first side 242*a* of the end effector 242 engages the first surface 122*a* of the substrate 122 during the transferring. FIG. 5D shows the end effector 242 disposed in the second orientation 251*b* (see FIG. 2D), where the first side 242*a* is engaged with the first surface 122*a* of the substrate 122. Engaging the first side 242*a* of the end effector 242 with the first surface 122*a* of the substrate 122 facilitates positioning of the substrate 122 on the pedestal 152 (FIG. 1C) in a second surface 122*b* "face down" orientation.

Typically, after disengaging the end effector 242 from the substrate 122 at activity 406 (see FIG. 5C), the arm 236 is moved away from the substrate alignment station 260 to provide clearance between the end effector 242 and the substrate alignment station 260 and/or the substrate 122 disposed therein. In some embodiments, the arm 236 may be retracted along the third axis 240 to provide the clearance between the end effector 242 and the substrate 122. In some embodiments, the end effector 242 is rotated or pivoted about the fifth axis 253, using the rotary actuator 245, from the first orientation 251*a* (FIG. 2C) to the second orientation 251*b* (FIG. 2D). In some other embodiments, changing the orientation of the end effector 242 includes rotating or pivoting the arm 236 about the third axis 240 to move the end effector 242 between the first orientation 251*a* (FIG. 2C) and the second orientation 251*b* (FIG. 2D). In some embodiments, the arm 236 is rotated or pivoted about the third axis 240 by about 180° such that the first side 242*a* of the end effector 242 is facing away from the second surface 122*b* of the substrate 122. In some embodiments, the arm 236 is rotated by about 180° or more, such as from about 180° to about 360°. In some embodiments, the arm 236 is rotated clockwise, counterclockwise, or both. In some embodiments, a second orientation of the arm 236 with respect to the third axis 240 is opposite from a first orientation of the arm 236 with respect to the third axis 240.

Here, activity 408 includes moving the arm 236 along the second axis 234 of the overhead track 232 until the end effector 242 passes over the substrate alignment station 260. In this position, the first side 242*a* of the end effector 242, disposed in the second orientation 251*b*, is facing the first surface 122*a* of the substrate 122 (see FIG. 5D). The arm 236 may be moved along the second axis 234 before, after, or concurrent with changing the orientation of the end effector from the first orientation 251*a* to the second orientation 251*b*. Activity 408 further includes extending the arm 234 along the third axis 240 to position the end effector 242 for engaging the first surface 122*a* of the substrate 122, and engaging the end effector 242 to the first surface 122*a* of the substrate 122.

From this position, transferring the substrate 122 to the substrate carrier loading station 103 involves carrying out activity 404 in reverse order. Here, the first side 242*a* of the end effector 242 engages the first surface 122*a* of the substrate 122. Therefore, when the end effector 242 is proximate the substrate carrier loading station 103, the second surface 122b of the substrate is in a face down orientation such that the pedestal 152 of the load cup 150 engages the second surface 122b of the substrate 122, and the substrate carrier 110 engages the first surface 122a of the substrate 122. Thus, when the substrate carrier 110 is moved about the carriage axis C to position the substrate carrier 110 above the polishing pad 106, the second surface 122b of the substrate 122 is facing the polishing pad 106, as shown in FIG. 5E.

Figure 5E:
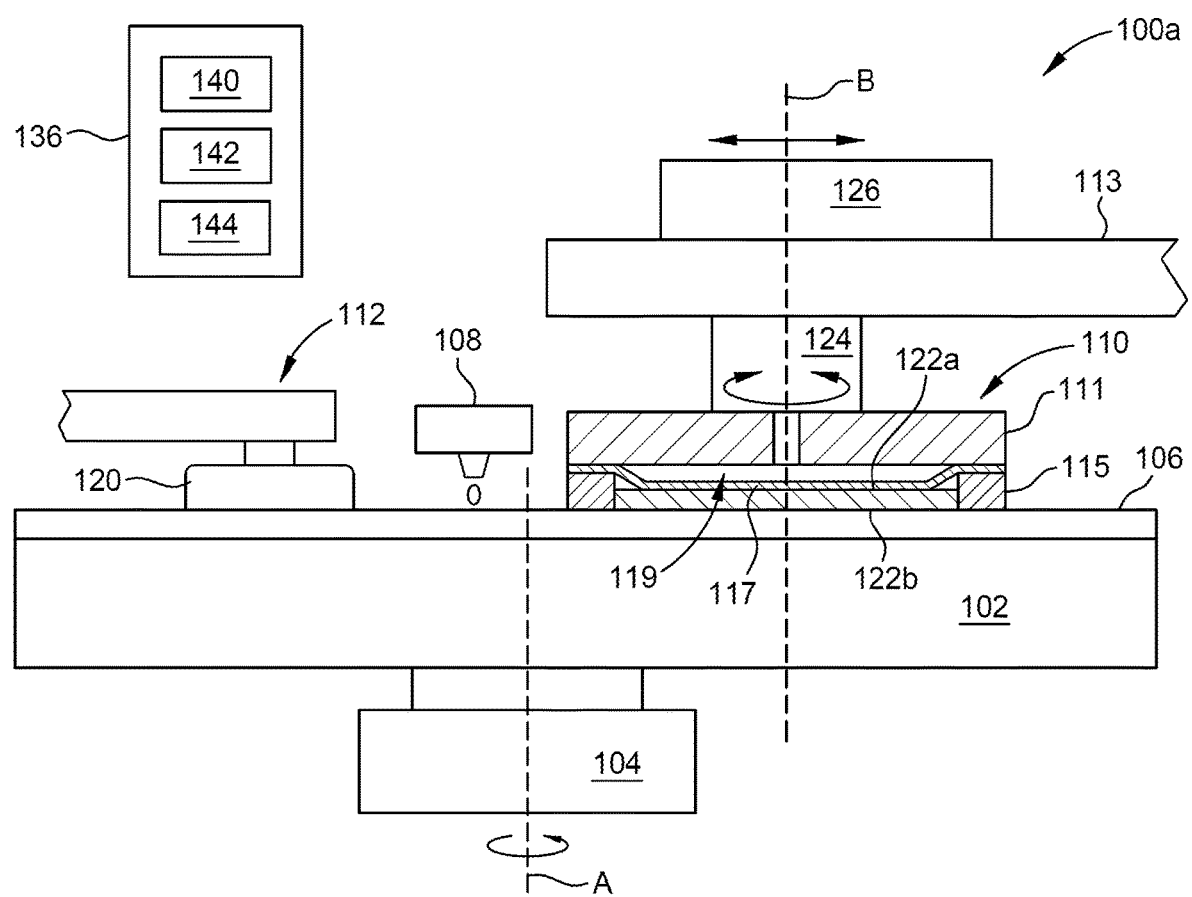
FIG. 5E is a schematic side view of a polishing station which may be used to practice the method of FIG. 4, according to one embodiment.

FIG. 5E is a schematic side view of the polishing station 100a illustrating the activity 410. At activity 410, the method 400 includes urging the second surface 122b of the substrate 122 against one of the plurality of polishing pads 106. Here, the substrate carrier 110 engages the first surface 122a of the substrate 122 during the urging, e.g., the first surface 122a is in contact with the membrane 117.

Beneficially, the method 400 may be used to reverse the orientation of SiC substrates in their substrate holder between sequential single-sided CMP processes of opposite surfaces of a substrate without removing the substrate from the processing system. Thus, the method 400 desirably reduces and/or eliminates undesirable errors and delays during processing and the corresponding increase in substrate processing costs associated therewith.

Figure 6A:
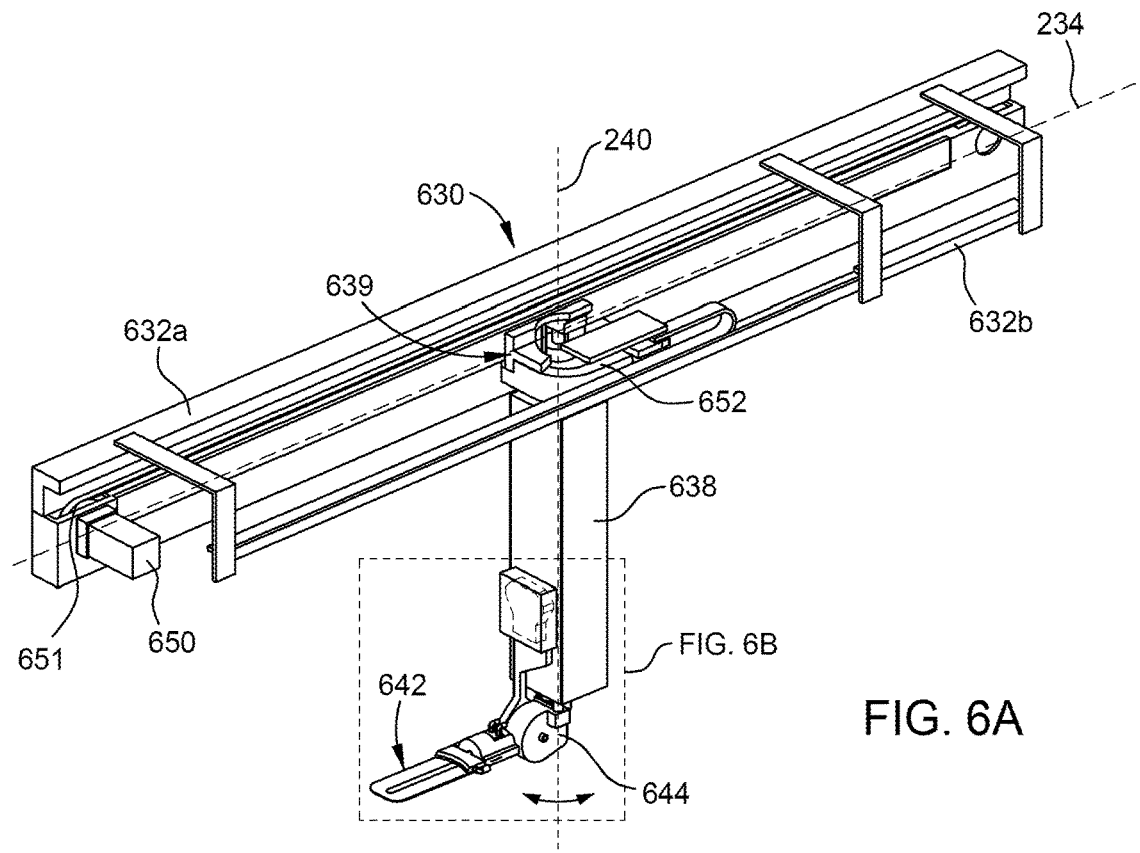
FIG. 6A is a schematic isometric view of an exemplary substrate handler assembly, according to one or more embodiments.

FIG. 6A is an isometric view of an exemplary substrate handler assembly 630 that may be in place of the substrate handler assembly 200 of the multi-station polishing system shown in FIG. 2A. The substrate handler assembly 630 generally includes an overhead track 632, a housing 638, an end effector 642, and first and second actuators 650, 652. Here, the overhead track 632 includes first and second rails 632a, 632b oriented along the second axis 234. A carriage assembly 639 is movable along the first and second rails 632a, 632b. The housing 638 is coupled to a base of the carriage assembly 639 and is movable therewith. The carriage assembly 639 includes the second actuator 652 for rotating the housing 638, including an arm (not shown) disposed therein, about the third axis 240. Here, the first actuator 650 is positioned between the first and second rails 632a, 632b of the overhead track 632. The first actuator 650 drives a belt 651 which runs along the first rail 632a. The belt 651 is coupled to the carriage assembly 639 for moving the carriage assembly 639 along the first and second rails 632a, 632b. The end effector 642 is coupled to the housing 638 via the arm (not shown) and a wrist assembly 644.

Figure 6B:
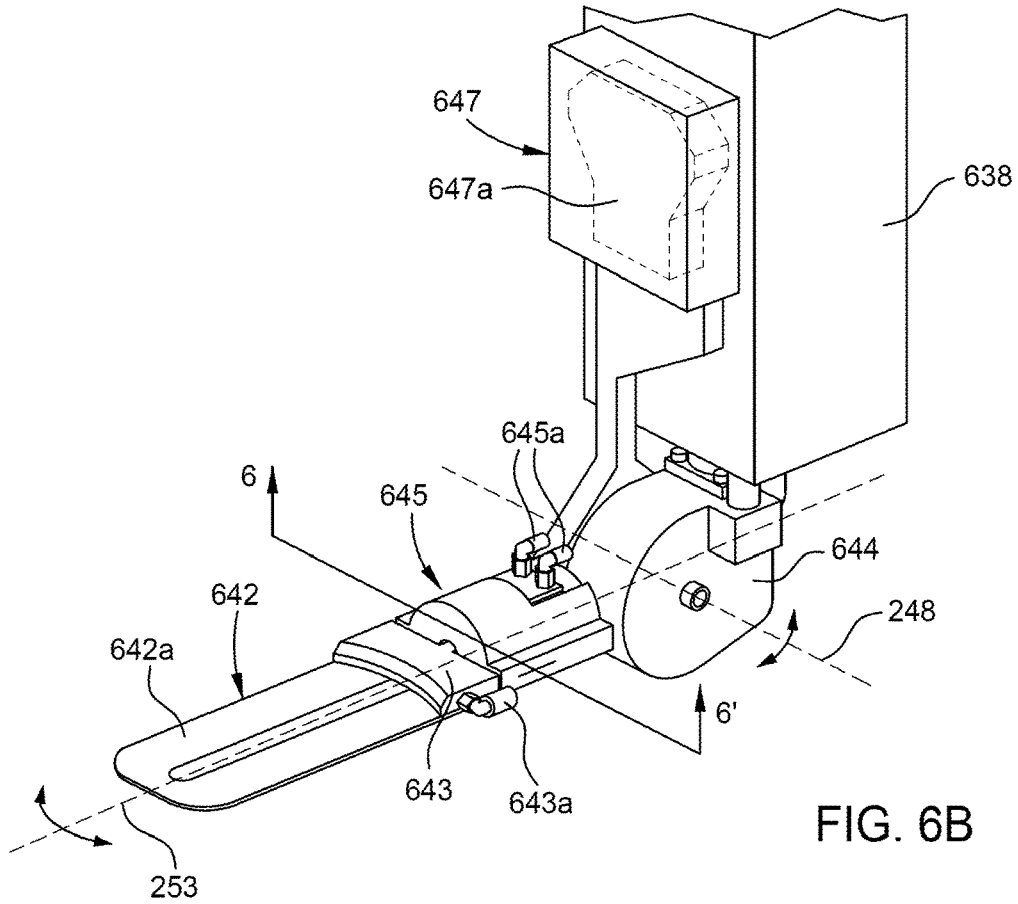
FIG. 6B is an enlarged isometric view of an exemplary end effector shown in FIG. 6A.

FIG. 6B is an enlarged isometric view of a portion of FIG. 6A that includes the end effector 642. Here, the end effector 642 is a vacuum blade having a first side 642a (shown facing upwardly). A blade mount 643 couples the end effector 642 to the wrist assembly 644. The blade mount 643 includes a connector 643a for supplying vacuum pressure to a port (not shown) formed in the second side 642b of end effector 642. A rotary actuator 645 is coupled between the blade mount 643 and the wrist assembly 644. The rotary actuator 645 drives rotation of the end effector 642 about the fifth axis 253 between the first orientation 251a and the second orientation 251b (FIGS. 2C-2D). The rotary actuator 645 includes a plurality, here a pair, of pneumatic connectors 645a for driving the rotation of the end effector 642 about the fifth axis 253.

Here, a mapper 647 is coupled to an arm that is disposed in a generally orthogonal orientation to the end effector 642. Typically, the arm maintains the generally orthogonal orientation with relationship to the end effector 642 as both are swung about the fourth axis 248. The mapper 647 includes one or more sensors 647a which may be used for tracking a plurality of substrates 122. The sensing functionality of the mapper 647 may be used, in combination with the system controller 136, to perform one or more of locating each substrate 122 in the one or more cassettes 220, numbering each substrate 122 in the one or more cassettes 220, storing the location of each substrate 122 in the one or more cassettes 220 in the memory of the system controller 136, tracking each substrate 122 throughout processing, and returning each substrate 122 to a respective location in the one or more cassettes 220. Here, the mapper 647 is integral with the rotary actuator 645 such that the rotary actuator 645 and the mapper 647 have a fixed relative position. In embodiments where the rotary actuator 645 and the mapper 647 are integrally formed, repeatability of mapper 647 sensing is improved. In some other embodiments, the mapper 647 is coupled to the arm 638, the overhead track 632, or another component of the substrate handler assembly 630.

Figure 6D:
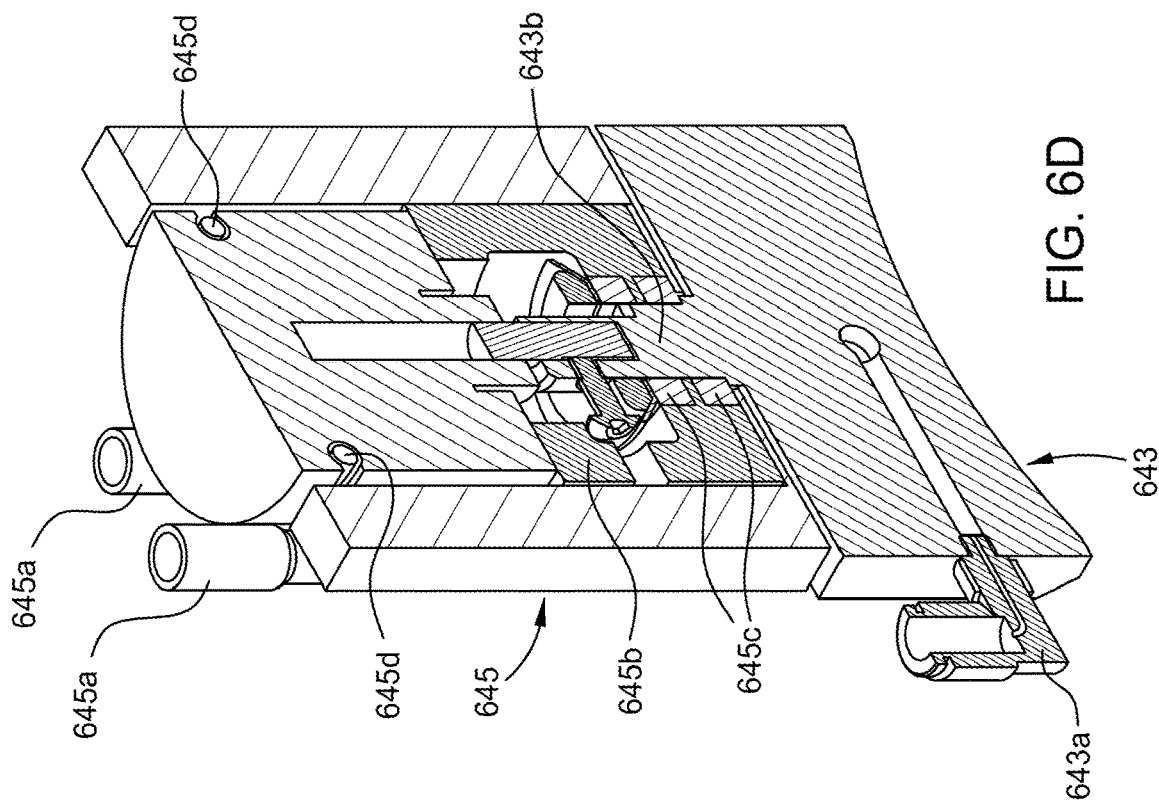
FIG. 6D is an isometric view of the rotary actuator of FIG. 6C.
Figure 6C:
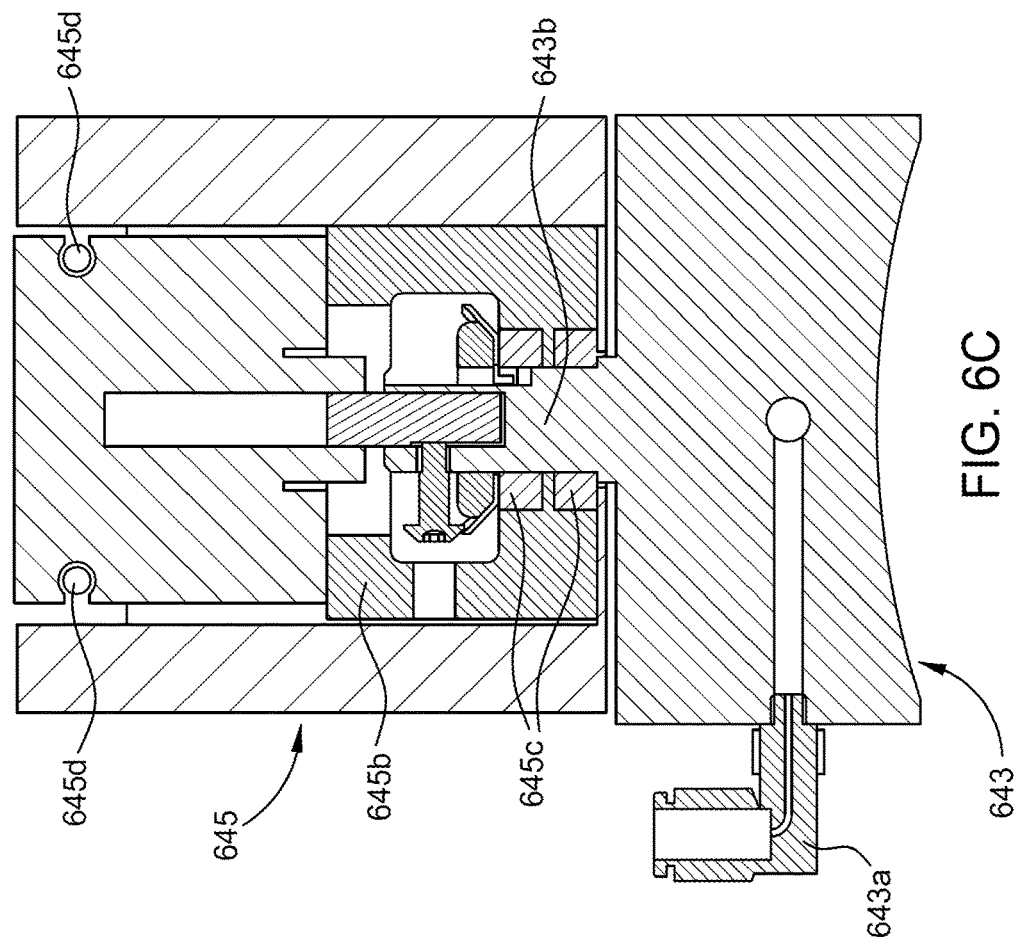
FIG. 6C is an enlarged sectional view of an exemplary rotary actuator taken along section line 6-6' of FIG. 6B.

FIG. 6C is an enlarged sectional view of an exemplary rotary actuator 645 taken along section line 6-6' of FIG. 6B. FIG. 6D is an isometric view of the rotary actuator 645 of FIG. 6C. The rotary actuator 645 includes a bearing housing 645b and bearings 645c disposed therein. The bearings 645c are disposed between the bearing housing 645b and a bearing shaft 643b of the blade mount 643. The rotary actuator 645, having the end effector 642 coupled thereto, is rotated in a first direction using a first one of the pair of pneumatic connectors 645a. The rotary actuator 645 is rotated in a second opposite direction using a second one of the pair of pneumatic connectors 645a. The rotary actuator 645 includes one or more sensors 645d for sensing a position of the rotary actuator 645 and the end effector 642 attached thereto. In some embodiments, the sensors 645d are magnetic-based proximity sensors, e.g., Hall Effect sensors. The sensors 645d are configured to indicate whether the end effector 642 has been rotated to a desired position, e.g., flipped. In some embodiments, a sudden drop or sudden increase in air pressure in the pneumatic system coupled to the pair of connectors 645a indicates an issue with rotation of the rotary actuator 645.

While the foregoing is directed to embodiments of the present disclosure, other and further embodiments of the disclosure may be devised without departing from the basic scope thereof, and the scope thereof is determined by the claims that follow.

The invention claimed is:

1. A substrate polishing system, comprising:
 a substrate alignment station having a frame, the frame having a bottom and sides, the bottom configured to support a substrate at the edge of the substrate, and the sides configured to support the substrate in an upright and substantially vertical position without gripping the substrate;
 a plurality of polishing stations, each comprising a rotatable polishing platen;
 a substrate carrier loading station;
 a substrate handler comprising an end effector having a first side and a second side that is opposite of the first side; and
 a non-transitory computer readable medium having instructions stored thereon for a substrate processing method, the method comprising sequentially:
  (a) urging a first surface of a substrate against one of a plurality of polishing pads, wherein the plurality of polishing pads are disposed on corresponding ones of the plurality of rotatable polishing platens;
  (b) transferring, using the first side of the end effector, the substrate from the substrate carrier loading station to the substrate alignment station and placing the substrate in the substrate alignment station in a substantially vertical position;

(c) transferring, using the first side of the end effector, the substrate from the substrate alignment station to the substrate carrier loading station; and (d) urging a second surface of the substrate against one of the plurality of polishing pads.

2. The system of claim 1, wherein the substrate handler further comprises an arm movable along an overhead track between the substrate alignment station and a substrate cassette disposed in a substrate holding area, and wherein the end effector is rotatably coupled to the arm.

3. The system of claim 2, wherein the overhead track is aligned with a first longitudinal axis of a basin defining the substrate holding area, and wherein the end effector is rotatable about a second axis substantially orthogonal to the first axis.

4. The system of claim 3, wherein (b) transferring the substrate from the substrate carrier loading station to the substrate alignment station comprises engaging the end effector with the second surface of the substrate, and wherein (c) transferring the substrate from the substrate alignment station to the substrate carrier loading station comprises:
rotating the end effector about the second axis by about 180 degrees; and
after rotating, engaging the first side of the end effector to the first surface of the substrate.

5. The system of claim 4, wherein the substrate handler further comprises a wrist assembly configured to rotate the end effector about the second axis relative to the arm.

6. The system of claim 4, wherein rotating the end effector about the second axis by about 180 degrees reverses an orientation of the end effector first and second sides.

7. The system of claim 1, wherein the substrate carrier loading station comprises a load cup, the method further comprising:
transferring the substrate from one of the plurality of polishing stations to the load cup, wherein the first surface of the substrate is in a face down orientation with respect to the load cup after the transferring; and
transferring, the substrate from the load cup to one of the plurality of polishing stations, wherein the second surface of the substrate is in a face down orientation with respect to the load cup before the transferring.

8. A method for processing a substrate, comprising (a) urging a first surface of a substrate against one of a plurality of polishing pads, wherein the plurality of polishing pads are disposed on corresponding ones of a plurality of rotatable polishing platens;

(b) transferring, using a first side of an end effector, the substrate from a substrate carrier loading station to a substrate alignment station and placing the substrate in the substrate alignment station in a substantially vertical position, the substrate alignment station having a frame, the frame having a bottom and sides, the bottom configured to support the substrate at the edge of the substrate, and the sides configured to support the substrate in an upright and substantially vertical position without gripping the substrate;

(c) transferring, using the first side of the end effector, the substrate from the substrate alignment station to the substrate carrier loading station; and (d) urging a second surface of the substrate against one of the plurality of polishing platens.

9. The method of claim 8, wherein the end effector is rotatably coupled to an arm, the method further comprising moving the arm along an overhead track between the substrate alignment station and a substrate cassette.

10. The method of claim 9, wherein the arm moves along a first axis of the overhead track, the method further comprising rotating the end effector about a second axis substantially orthogonal to the first axis.

11. The method of claim 10, wherein (b) transferring the substrate from the substrate carrier loading station to the substrate alignment station comprises engaging the end effector with the second surface of the substrate, and wherein (c) transferring the substrate from the substrate alignment station to the substrate carrier loading station comprises:
rotating the end effector about the second axis by about 180 degrees; and
after rotating, engaging the first side of the end effector to the first surface of the substrate.

12. The method of claim 11, wherein the end effector is rotatably coupled to the arm by a wrist assembly, and wherein rotating the end effector about the second axis comprises rotating the wrist assembly relative to the arm.

13. The method of claim 11, wherein the end effector has a second side that is opposite of the first side, and wherein rotating the end effector about the second axis by about 180 degrees reverses an orientation of the end effector first and second sides.

14. The method of claim 8, wherein the substrate carrier loading station comprises a load cup, the method further comprising:
transferring the substrate from one of a plurality of polishing stations to the load cup, wherein the first surface of the substrate is in a face down orientation with respect to the load cup after the transferring; and
transferring, the substrate from the load cup to one of the plurality of polishing stations, wherein the second surface of the substrate is in a face down orientation with respect to the load cup before the transferring.

15. A non-transitory computer readable medium having instructions stored thereon for a substrate processing method, the method comprising:

(a) urging a first surface of a substrate against one of a plurality of polishing pads, wherein the plurality of polishing pads are disposed on corresponding ones of a plurality of rotatable polishing platens;

(b) transferring, using a first side of an end effector, the substrate from a substrate carrier loading station to a substrate alignment station and placing the substrate in the substrate alignment station in a substantially vertical position, the substrate alignment station having a frame, the frame having a bottom and sides, the bottom configured to support the substrate at the edge of the substrate, and the sides configured to support the substrate in an upright and substantially vertical position without gripping the substrate;

(c) transferring, using the first side of the end effector, the substrate from the substrate alignment station to the substrate carrier loading station; and (d) urging a second surface of the substrate against one of the plurality of polishing platens.

16. The computer readable medium of claim 15, wherein the end effector is rotatably coupled to an arm, the method further comprising moving the arm along an overhead track between the substrate alignment station and a substrate cassette.

17. The computer readable medium of claim 16, wherein the arm moves along a first axis of the overhead track, the method further comprising rotating the end effector about a second axis substantially orthogonal to the first axis.

18. The computer readable medium of claim 17, wherein (b) transferring the substrate from the substrate carrier loading station to the substrate alignment station comprises engaging the end effector with the second surface of the substrate, and wherein (c) transferring the substrate from the substrate alignment station to the substrate carrier loading station comprises:
   rotating the end effector about the second axis by about 180 degrees; and
   after rotating, engaging the first side of the end effector to the first surface of the substrate.

19. The computer readable medium of claim 18, wherein the end effector is rotatably coupled to the arm by a wrist assembly, and wherein rotating the end effector about the second axis comprises rotating the wrist assembly relative to the arm.

20. The computer readable medium of claim 18, wherein the end effector has a second side that is opposite of the first side, and wherein rotating the end effector about the second axis by about 180 degrees reverses an orientation of the end effector first and second sides.

* * * * *